United States Patent
Akae et al.

(10) Patent No.: US 8,895,457 B2
(45) Date of Patent: Nov. 25, 2014

(54) METHOD OF MANUFACTURING SEMICONDUCTOR DEVICE AND SUBSTRATE PROCESSING APPARATUS

(75) Inventors: Naonori Akae, Toyama (JP); Kotaro Murakami, Toyama (JP); Yoshiro Hirose, Toyama (JP); Kenji Kameda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/582,861

(22) PCT Filed: Feb. 18, 2011

(86) PCT No.: PCT/JP2011/053508
§ 371 (c)(1),
(2), (4) Date: Sep. 25, 2012

(87) PCT Pub. No.: WO2011/111498
PCT Pub. Date: Sep. 15, 2011

(65) Prior Publication Data
US 2013/0017685 A1   Jan. 17, 2013

(30) Foreign Application Priority Data
Mar. 8, 2010   (JP) ................. 2010-050752

(51) Int. Cl.
*C23C 16/34* (2006.01)
*C23C 16/40* (2006.01)
(Continued)

(52) U.S. Cl.
CPC ............ *C23C 16/4405* (2013.01); *C23C 16/30* (2013.01); *C23C 16/345* (2013.01); *C23C 16/347* (2013.01); *C23C 16/402* (2013.01); *C23C 16/45531* (2013.01); *H01L 21/02126* (2013.01); *H01L 21/0228* (2013.01); *Y10S 438/905* (2013.01)
USPC . 438/791; 118/715; 427/255.28; 427/255.23; 427/255.18; 438/905; 134/22.1; 134/24; 134/26; 134/34; 134/42; 134/19

(58) Field of Classification Search
CPC .............................. B08B 7/00; C23C 16/4405
USPC .............. 438/791, 905; 118/715; 427/255.28, 427/255.23, 255.18; 134/22.1, 24, 26, 34, 134/42
See application file for complete search history.

(56) References Cited

U.S. PATENT DOCUMENTS 5,358,893 A * 10/1994 Yang et al. .................... 438/448
5,976,900 A * 11/1999 Qiao et al. ...................... 438/14
(Continued)

FOREIGN PATENT DOCUMENTS

JP   A-2006-165317   6/2006
JP   WO 2007/111348 A1   10/2007
(Continued)

OTHER PUBLICATIONS

Apr. 19, 2011 International Search Report issued in International Patent Application No. PCT/JP2011/053508.
(Continued)

*Primary Examiner* — Su Kim
*Assistant Examiner* — Regan J Rundio
(74) *Attorney, Agent, or Firm* — Oliff PLC

(57) ABSTRACT

To provide a method of manufacturing a semiconductor device, including: forming a thin film different from a silicon oxide film on a substrate by supplying a processing gas into a processing vessel in which the substrate is housed; removing a deposit including the thin film adhered to an inside of the processing vessel by supplying a fluorine-containing gas into the processing vessel after executing forming the thin film prescribed number of times; and forming a silicon oxide film having a prescribed film thickness on the inside of the processing vessel by alternately supplying a silicon-containing gas, and an oxygen-containing gas and a hydrogen-containing gas into the heated processing vessel in which a pressure is set to be less than an atmospheric pressure after removing the deposit.

20 Claims, 10 Drawing Sheets

(51) Int. Cl.
*B08B 5/00* (2006.01)
*H01L 21/31* (2006.01)
*C23C 16/00* (2006.01)
*C23C 16/44* (2006.01)
*C23C 16/30* (2006.01)
*C23C 16/455* (2006.01)
*H01L 21/02* (2006.01)

(56) References Cited

U.S. PATENT DOCUMENTS

| | | | | |
|---|---|---|---|---|
| 2006/0032442 | A1* | 2/2006 | Hasebe | 118/715 |
| 2006/0121194 | A1* | 6/2006 | Aiso | 427/248.1 |
| 2009/0011575 | A1* | 1/2009 | Shimomura et al. | 438/479 |
| 2009/0149032 | A1 | 6/2009 | Kameda et al. | |
| 2009/0151632 | A1 | 6/2009 | Okuda et al. | |
| 2009/0181547 | A1 | 7/2009 | Okuda et al. | |
| 2009/0233454 | A1 | 9/2009 | Okada et al. | |
| 2009/0305517 | A1* | 12/2009 | Nakashima et al. | 438/786 |
| 2010/0105192 | A1* | 4/2010 | Akae et al. | 438/478 |
| 2010/0189927 | A1* | 7/2010 | Sato et al. | 427/579 |

FOREIGN PATENT DOCUMENTS

| | | |
|---|---|---|
| JP | A-2009-231794 | 10/2009 |
| JP | A-2009-246340 | 10/2009 |
| KR | 10-0861851 | 9/2008 |

OTHER PUBLICATIONS

Office Action dated Aug. 13, 2013 issued in Korean Patent Application No. 10-2012-7015430 (with translation).

* cited by examiner

| CLEANING TEMPERATURE (°C) | REMOVAL RATE (Å/min) | | | |
|---|---|---|---|---|
| | QUARTZ | SiO | SiN | SiCN |
| 500 | 49.0 | 6.1 | 30.0 | 24.2 |
| 600 | 2130 | 29.9 | 1540 | 861.9 |

(b)

| CLEANING TEMPERATURE (°C) | SELECTION RATIO | | | |
|---|---|---|---|---|
| | SiN/QUARTZ | SiN/SiO | SiCN/QUARTZ | SiCN/SiO |
| 500 | 0.6 | 4.9 | 0.5 | 3.9 |
| 600 | 0.7 | 51.6 | 0.4 | 28.9 |

| CLEANING TEMPERATURE (°C) | REMOVAL RATE (Å/min) | | | |
|---|---|---|---|---|
| | QUARTZ | SiO | SiN | SiCN |
| 400 | 14.5 | 11.9 | 147.6 | 306.6 |

(b)

| CLEANING TEMPERATURE (°C) | SELECTION RATIO | | | |
|---|---|---|---|---|
| | SiN/QUARTZ | SiN/SiO | SiCN/QUARTZ | SiCN/SiO |
| 400 | 10.2 | 12.4 | 21.2 | 25.8 |

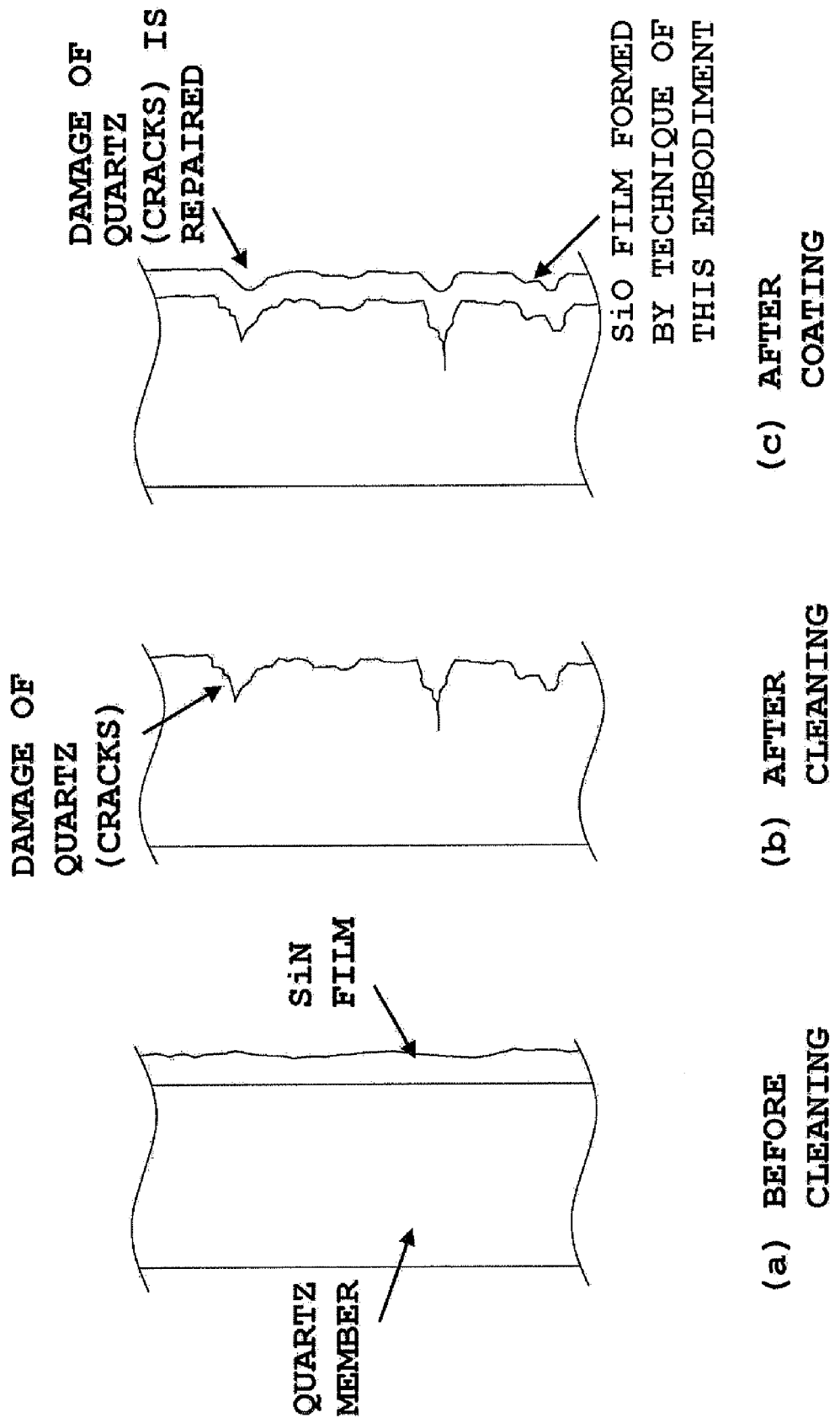

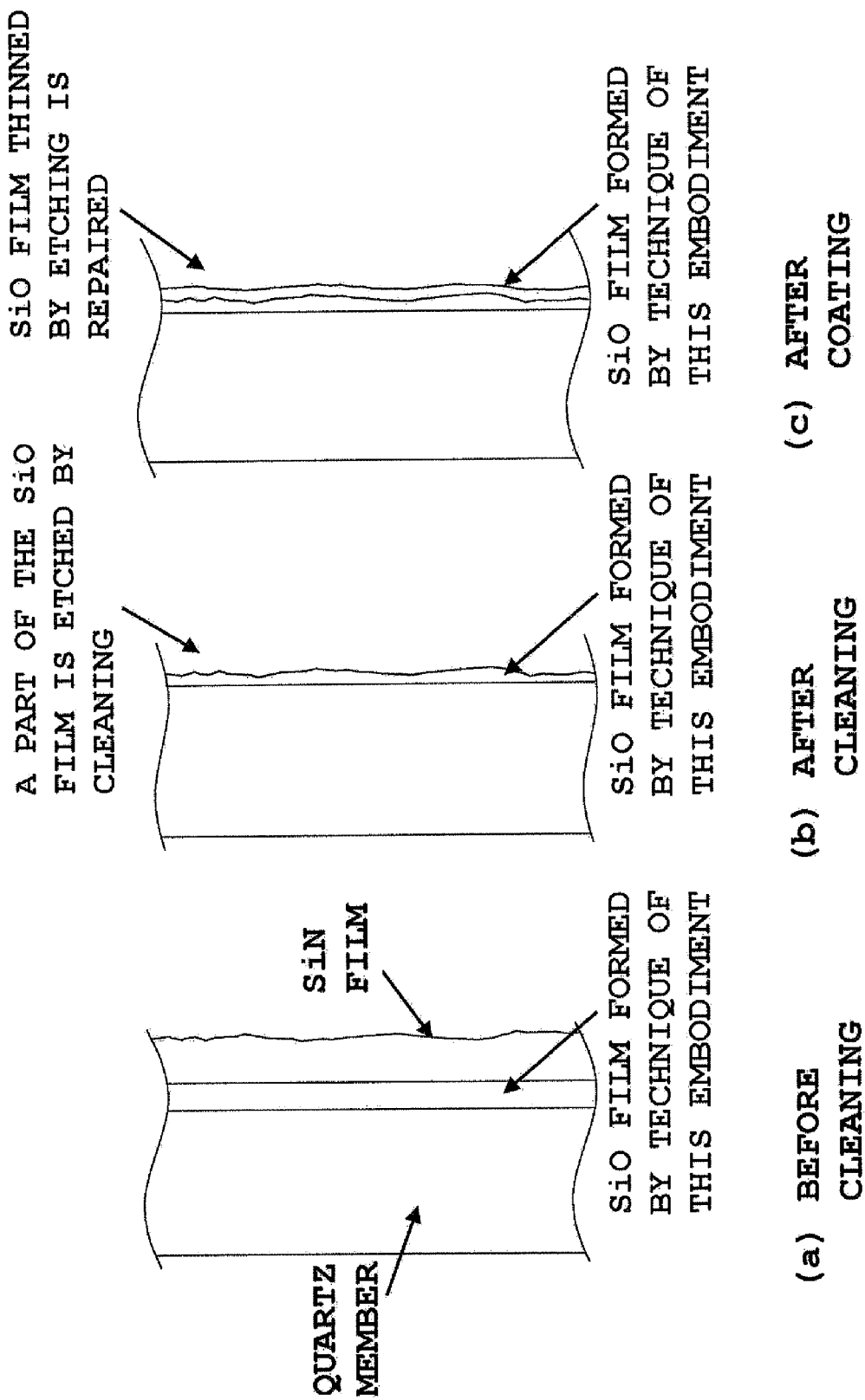

METHOD OF MANUFACTURING SEMICONDUCTOR DEVICE AND SUBSTRATE PROCESSING APPARATUS

The present application is based on Japanese Patent Application No. 2010-050752, filed on Mar. 8, 2010, the entire contents of which are hereby incorporated by reference.

BACKGROUND OF THE INVENTION

1. Technical Field

The present invention relates to a method of manufacturing a semiconductor device including forming a thin film on a substrate and a substrate processing apparatus.

2. Description of the Related Art

As one of the steps of manufacturing a semiconductor device, a thin film forming step can be given, which is the step of forming a thin film such as a silicon nitride film (SiN film) on a substrate. Also, the thin film forming step is the step performed by supplying a processing gas into a processing chamber into which the substrate is loaded. The thin film forming step is performed for the purpose of forming the thin film on a surface of the substrate. However, actually the thin film is formed not only on the surface of the substrate but also on an inner wall of the processing chamber in some cases. When the thin film is deposited thick, a force added thereby is increased to generate cracks and also generate foreign matters (particles) in the processing chamber in some cases. When the foreign matters are placed on the substrate, yield of manufacturing the semiconductor device is deteriorated.

Therefore, there is a need for removing the deposited thin film, every time the thickness of the thin film reaches a certain thickness. In recent years, a dry cleaning method has been preferably used, which is the method for removing a deposit including the thin film by flowing gas called a cleaning gas into the processing chamber. According to this method, there is no necessity for disassembling the processing chamber, the number of cleaning man-hours and a risk of damaging a component can be reduced, and the time required for restarting the thin film forming step can be shortened, to thereby improve an operating ratio of a substrate processing apparatus for executing the thin film forming step (for example see patent document 1).

PRIOR ART DOCUMENT

Patent document 1: Japanese Patent Laid Open Publication No. 2009-231794

SUMMARY OF THE INVENTION

Problem to be Solved by the Invention

In the aforementioned dry cleaning method, SiN film, etc., is removed by supplying the cleaning gas containing fluorine (F) elements such as thermally activated nitrogen fluoride ($NF_3$) gas, fluorine ($F_2$) gas, and chlorine fluoride ($ClF_3$) gas. Although the higher a temperature in the processing chamber is, the faster a removal rate for removing the SiN film is, damage received by quartz ($SiO_2$) constituting each member in the processing chamber is increased, with a result that foreign matters are generated from a quartz member. Further, although the damage received by the quartz member can be reduced by decreasing the temperature in the processing chamber, the removal rate for removing the SiN film is also reduced in some cases. Thus, it is difficult to achieve both the reduction of the damage received by the quartz member and the increase of the removal rate for removing the SiN film.

An object of the present invention is to provide a method of manufacturing a semiconductor device and a substrate processing apparatus capable of achieving both the reduction of the damage received by the quartz member and the increase of the removal rate for removing the SiN film, when inside of the processing chamber is cleaned using the cleaning gas containing fluorine elements.

Means for Solving the Problem

According to an aspect of the present invention, there is provided a method of manufacturing a semiconductor device, including:

forming a thin film different from a silicon oxide film on a substrate by supplying a processing gas into a processing vessel in which the substrate is housed;

removing a deposit including the thin film adhered to an inside of the processing vessel by supplying fluorine-containing gas into the processing vessel after executing forming the thin film prescribed number of times; and forming a silicon oxide film having a prescribed film thickness on the inside of the processing vessel by alternately supplying a silicon-containing gas, and an oxygen-containing gas and a hydrogen-containing gas into the heated processing vessel in which a pressure is set to be less than an atmospheric pressure after removing the deposit.

According to other aspect of the present invention, there is provided a method of manufacturing a semiconductor device, including:

forming a silicon oxide film having a prescribed film thickness on an inside of a processing vessel by alternately supplying a silicon-containing gas, and an oxygen-containing gas and a hydrogen-containing gas into a heated processing vessel in which a pressure is set to be less than an atmospheric pressure;

forming a thin film different from the silicon oxide film on the substrate by supplying a processing gas into the processing vessel in which a substrate is housed after forming the silicon oxide film;

removing a deposit including the thin film adhered to an inside of the processing vessel by supplying a fluorine-containing gas into the processing vessel after executing forming the thin film prescribed number of times; and forming a silicon oxide film having a prescribed film thickness on the inside of the processing vessel by alternately supplying the silicon-containing gas, and the oxygen-containing gas and the hydrogen-containing gas into the heated processing vessel in which a pressure is set to be less than an atmospheric pressure after removing the deposit.

According to further other aspect of the present invention, there is provided a substrate processing apparatus: including:

a processing vessel in which a substrate is housed;

a heater configured to heat an inside of the processing vessel;

a pressure adjuster configured to adjust a pressure in the processing chamber;

a processing gas supply system configured to supply a processing gas into the processing vessel;

a fluorine-containing gas supply system configured to supply a fluorine-containing gas into the processing vessel:

a silicon-containing gas supply system configured to supply a silicon-containing gas into the processing chamber:

an oxygen-containing gas supply system configured to supply an oxygen-containing gas into the processing vessel;

a hydrogen-containing gas supply system configured to supply a hydrogen-containing gas into the processing vessel; and a controller configured to control the heater, the pressure adjuster, the processing gas supply system, the fluorine-containing gas supply system, the silicon-containing gas supply system, the oxygen-containing gas supply system, and the hydrogen-containing gas supply system, so as to execute forming a thin film different from a silicon oxide film on the substrate by supplying the processing gas into the processing vessel in which the substrate is housed; removing a deposit including the thin film adhered to the inside of the processing vessel by supplying the fluorine-containing gas into the processing vessel after executing forming the thin film prescribed number of times; and forming a silicon oxide film having a prescribed film thickness on the inside of the processing vessel by alternately supplying the silicon-containing gas, and the oxygen-containing gas and the hydrogen-containing gas into the heated processing vessel in which a pressure is set to be less than an atmospheric pressure after removing the deposit.

Advantage of the Invention

According to a method of manufacturing a semiconductor device and a substrate processing apparatus of the present invention, both of the reduction of a damage received by a quartz member and the increase of a removal rate of removing the SiN film is achieved, when the inside of a processing chamber is cleaned using a cleaning gas containing fluorine elements.

BRIEF DESCRIPTION OF THE DRAWINGS

FIG. 4($a$) is a table showing a measurement result of a removal rate for removing quartz, SiO film, SiN film, and SiCN film, and ($b$) is a table showing a selection ratio based on the measurement result of ($a$).

FIG. 5 ($a$) is a table showing the measurement result of the removal rate for removing the quartz, SiO film, SiN film, and SiCN film, and ($b$) is a table showing the selection ratio based on the measurement result of ($a$).

FIG. 9($a$) shows a state of the inner wall, etc., of the processing chamber before cleaning, and ($b$) shows a state that damage is received by the inner wall, etc., of the processing chamber by overcleaning, and ($c$) shows a state that the damage of the inner wall, etc., of the processing chamber is repaired by forming the SiO film using the technique of this embodiment, respectively.

FIG. 10($a$) shows a state of the inner wall, etc., of the processing chamber before cleaning when the SiO film is formed before the film is formed for the first time, and ($b$) shows a state that the inner wall, etc., of the processing chamber is protected by the SiO film from overcleaning, and ($c$) shows a state that a SiO film of a base is repaired by the technique of this embodiment, respectively.

MODES FOR CARRYING OUT THE INVENTION

Embodiments of the present invention will be described hereafter based on the figures.

(1) Structure of a Substrate Processing Apparatus

Figure 1:
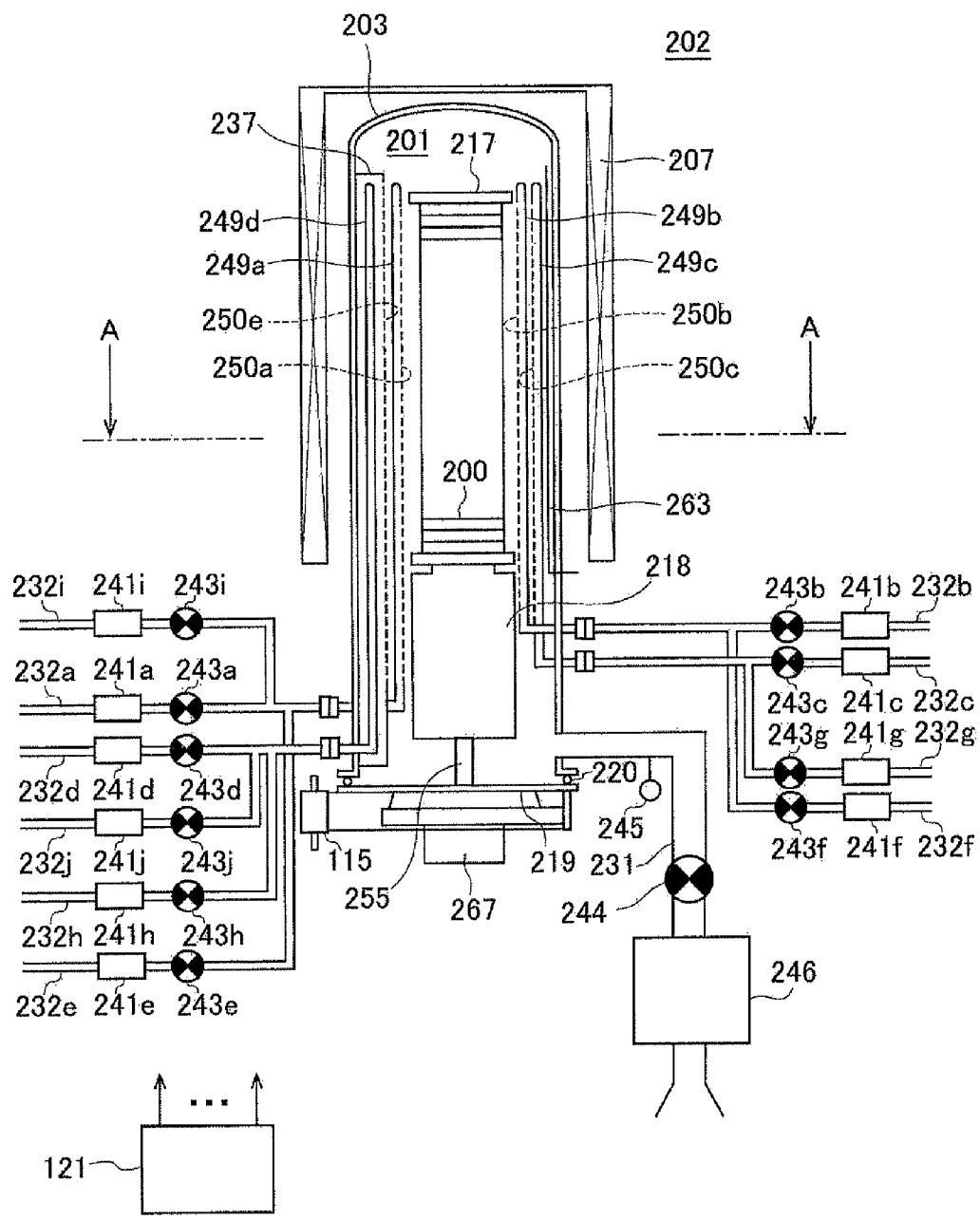
FIG. 1 is a schematic block diagram of a vertical processing furnace of a substrate processing apparatus suitably used in this embodiment, and is a view showing a processing furnace portion in a vertical sectional face.
Figure 2:
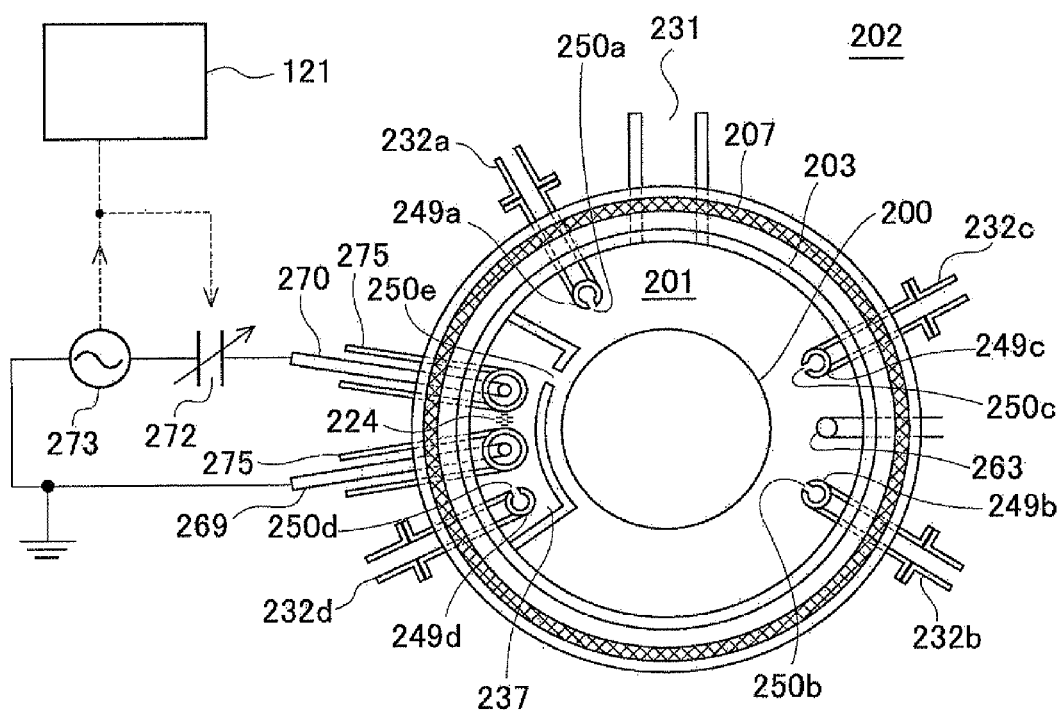
FIG. 2 is a schematic block diagram of the vertical processing furnace of the substrate processing apparatus suitably used in this embodiment, and is a view showing a sectional view of the processing furnace portion of FIG. 1 taken along the line A-A.

FIG. 1 is a schematic block diagram of a vertical processing furnace of a substrate processing apparatus suitably used in this embodiment, wherein a processing furnace 202 portion is shown by a vertical sectional face. FIG. 2 is a schematic block diagram of the vertical processing furnace suitably used in this embodiment, and the processing furnace 202 portion is shown by a sectional face of FIG. 1 taken along the line A-A.

As shown in FIG. 1, the processing furnace 202 has a heater 207, as a heating unit (heating mechanism). The heater 207 has a cylindrical shape, and is vertically installed by being supported by a heater base (not shown) as a holding plate. Note that the heater 207 also functions as an activation mechanism for thermally activating gas as will be described later.

A reaction tube 203 constituting a reaction vessel (processing vessel) is disposed inside of the heater 207 concentrically with the heater 207. The reaction tube 203 is made of a heat resistant material such as quartz ($SiO_2$) or silicon carbide (SiC), and is formed into a cylindrical shape with an upper end closed and a lower end opened. A processing chamber 201 is formed in a cylindrical hollow part of the reaction tube 203, and is configured to house a wafer 200 as a substrate by a boat 217 as will be described later in a horizontal posture in a state of being arranged vertically in multiple stages.

A first nozzle 249a, a second nozzle 249b, a third nozzle 249c, and a fourth nozzle 249d are provided inside of the processing chamber 201 so as to pass through a lower part of the reaction tube 203. A first gas supply tube 232a, a second gas supply tube 232b, a third gas supply tube 232c, and a fourth gas supply tube 232d are respectively connected to the first nozzle 249a, the second nozzle 249b, the third nozzle 249c, and the fourth nozzle 249d. Thus, the reaction tube 203 includes four nozzles 249a, 249b, 249c, 249d, and four gas supply tubes 232a, 232b, 232c, 232d, and is configured to supply a plurality of kinds of gases into the processing chamber 201.

A mass flow controller (MFC) 241a being a flow controller (flow control section), and a valve 243a being an open/close valve are provided on the first gas supply tube 232a sequentially from an upstream direction. Further, a fifth gas supply tube 232i is connected to a downstream side of the valve 243a of the first gas supply tube 232a. A mass flow controller 241i being a flow controller (flow control part), and a valve 243i being the open/close valve are provided on the fifth gas supply tube 232*i* sequentially from the upstream direction. Further, a first inert gas supply tube 232*e* is connected to the downstream side of a connection part connected to the fifth gas supply tube 232*i* on the first gas supply tube 232*a*. A mass flow controller 241*e* being the flow controller (flow control part), and a valve 243*e* being the open/close valve are provided on the first inert gas supply tube 232*e* sequentially from the upstream direction. Further, the aforementioned first nozzle 249*a* is connected to a tip end part of the first gas supply tube 232*a*. The first nozzle 249*a* is provided in an arcuate space between the inner wall of the reaction tube 203 and the wafer 200 along a lower part to an upper part of the inner wall of the reaction tube 203, so as to rise toward an upper part in a laminating direction of the wafer 200. The first nozzle 249*a* is formed as an L-shaped long nozzle. Gas supply holes 250*a* for supplying gas are provided on a side face of the first nozzle 249*a*. The gas supply holes 250*a* are opened to face a center of the reaction tube 203. A plurality of gas supply holes 250*a* are provided extending from the lower part to the upper part of the reaction tube 203, each of them having the same opening area and provided at the same opening pitch. The first gas supply system is mainly constituted of the first gas supply tube 232*a*, the mass flow controller 241*a*, the valve 243*a*, and the first nozzle 249*a*. Further, the fifth gas supply system is mainly constituted of the fifth gas supply tube 232*i*, the mass flow controller 241*i*, and the valve 243*i*. Further, the first inert gas supply system is mainly constituted of the first inert gas supply tube 232*e*, the mass flow controller 241*e*, and the valve 243*e*.

A mass flow controller (MFC) 241*b* being the flow controller (flow control part), and a valve 243*b* being the open/close valve are provided on the second gas supply tube 232*b* sequentially from the upstream direction. Further, the second inert gas supply tube 232*f* is connected to the downstream side of the valve 243*b* of the second gas supply tube 232*b*. A mass flow controller 241*f* being the flow controller (flow control part), and a valve 243*f* being the open/close valve are provided on the second inert gas supply tube 232*f* sequentially from the upstream direction. Further, the second nozzle 249*b* is connected to the tip end part of the second gas supply tube 232*b*. The second nozzle 249*b* is provided in an arcuate space between the inner wall of the reaction tube 203 and the wafer 200 along a lower part to an upper part of the inner wall of the reaction tube 203, so as to rise toward an upper part in a laminating direction of the wafer 200. The second nozzle 249*b* is formed as an L-shaped long nozzle. Gas supply holes 250*b* for supplying gas are provided on a side face of the first nozzle 249*b*. The gas supply holes 250*b* are opened to face a center of the reaction tube 203. A plurality of gas supply holes 250*b* are provided extending from the lower part to the upper part of the reaction tube 203, each of them having the same opening area and provided at the same opening pitch. The second gas supply system is mainly constituted of the second gas supply tube 232*b*, the mass flow controller 241*b*, the valve 243*b*, and the second nozzle 249*b*. Further, the second inert gas supply system is mainly constituted of the second inert gas supply tube 232*f*, the mass flow controller 241*f*, and the valve 243*f*.

A mass flow controller (MFC) 241*c* being the flow controller (flow control part), and a valve 243*c* being the open/close valve are provided on the third gas supply tube 232*c* sequentially from the upstream direction. Further, a third inert gas supply tube 232*g* is connected to a downstream side of the valve 243*c* of the third gas supply tube 232*c*. A mass flow controller 241*g* being the flow controller (flow rate control part), and a valve 243*g* being the open/close valve are provided on the third inert gas supply tube 232*g* sequentially from the upstream direction. Further, the third nozzle 249*c* is connected to the tip end part of the third gas supply tube 232*c*. The third nozzle 249*c* is provided in the arcuate space between the inner wall of the reaction tube 203 and the wafer 200 so as to rise toward the laminating direction of the wafer 200 extending from the lower part to the upper part of the inner wall of the reaction tube 203. The third nozzle 249*c* is formed as a L-shaped long nozzle. Gas supply holes 250*c* for supplying gas are provided on the side face of the third nozzle 249*c*. The gas supply holes 250*c* are opened to face the center of the reaction tube 203. A plurality of gas supply holes 250*c* are provided extending from the lower part to the upper part of the reaction tube 203, with each of them having the same opening area and further provided at the same opening pitch. The third gas supply system is mainly constituted of a third gas supply tube 232*c*, a mass flow controller 241*c*, a valve 243*c*, and a third nozzle 249*c*. Further, the third inert gas supply system is mainly constituted of a third inert gas supply tube 232*g*, amass flow controller 241*g*, and a valve 243*g*.

A mass flow controller (FMC) 241*d* being the flow controller (flow control part), and a valve 243*d* being the open/close valve are provided on the fourth gas supply tube 232*d* sequentially from the upstream direction. Further, a sixth gas supply tube 232*j* is connected to the downstream side of the valve 243*d* of the fourth gas supply tube 232*d*. Amass flow controller 241*j* being the flow controller (flow control part), and a valve 243*j* being the open/close valve are provided on the sixth gas supply tube 232*j* sequentially from the upstream direction. Further, a fourth inert gas supply tube 232*h* is connected to the downstream side of the connection part connected to the sixth gas supply tube 232*j* on the fourth gas supply tube 232*d*. A mass flow controller 241*h* being the flow controller (flow control part), and a valve 243*h* being the open/close valve are provided on the fourth inert gas supply tube 232*h* sequentially from the upstream direction. Further, a fourth nozzle 249*d* is connected to the tip end part of the fourth gas supply tube 232*d*. The fourth nozzle 249*d* is provided inside of a buffer chamber being a gas dispersion space.

The buffer chamber 237 is provided in the arcuate space between the inner wall of the reaction tube 203 and the wafer 200, over a part extending from the lower part to the upper part of the inner wall of the reaction tube 203, along the laminating direction of the wafer 200. Gas supply holes 250*e* for supplying gas are provided on an end portion of a wall adjacent to the wafer 200 in the buffer chamber 237. The gas supply holes 250*e* are opened to face the center of the reaction tube 203. A plurality of gas supply holes 250*e* are provided extending from the lower part to the upper part of the reaction tube 203, each of them having the same opening area and provided at the same opening pitch.

The fourth nozzle 249*d* is provided on the end portion which is the opposite side to the end portion where the gas supply holes 250*e* of the buffer chamber 237 are provided, along the lower part to the upper part of the inner wall of the reaction tube 203, so as to rise toward the upper part in the laminating direction of the wafer 200. The fourth nozzle 249*d* is formed as the L-shaped long nozzle. Gas supply holes 250*d* for supplying gas are provided on the side face of the fourth nozzle 249*d*. The gas supply holes 250*d* are opened to face the center of the buffer chamber 237. Similarly to the gas supply holes 250*e* of the buffer chamber 237, a plurality of gas supply holes 250*d* are provided extending from the lower part to the upper part of the reaction tube 203. Each of the plurality of gas supply holes 250*d* may have the same opening area at the same opening pitch from the upstream side (lower part) to the downstream side (upper part) in a case of a small differential pressure between the buffer chamber 237 and the processing chamber 201. However, in a case of a large differential pressure, the opening area may be set to be large, or the opening pitch may be set to be small, toward the downstream side from the upstream side.

In this embodiment, although there is a difference in a flow velocity, first, the gas is ejected with substantially the same amount of flow rate, from each of the gas supply holes 250d, by adjusting the opening area and the opening pitch of each of the gas supply holes 250d of the fourth nozzle 249d from the upstream side to the downstream side. Then, the gas ejected from each of the gas supply holes 250d is introduced into the buffer chamber 237 once, to thereby equalize a difference in flow velocity of the gas in the buffer chamber 237.

Namely, the gas ejected into the buffer chamber 237 from each of the gas supply holes 250d of the fourth nozzle 249d, is ejected into the processing chamber 201 from the gas supply holes 250e of the buffer chamber 237, after a particle velocity of each gas is reduced in the buffer chamber 237. Thus, the gas ejected into the buffer chamber 237 from each of the gas supply holes 250d of the fourth nozzle 249d has equalized flow rate and flow velocity at the time of being ejected into the processing chamber 201 from each of the gas supply holes 250e of the buffer chamber 237.

The fourth gas supply system is mainly constituted of the fourth gas supply tube 232d, the mass flow controller 241d, the valve 243d, the fourth nozzle 249d, and the buffer chamber 237. Further, the sixth gas supply system is mainly constituted of the sixth gas supply tube 232j, the mass flow controller 241j, the valve 243j, the fourth nozzle 249d, and the buffer chamber 237. Further, the fourth inert gas supply system is mainly constituted of the fourth inert gas supply tube 232h, the mass flow controller 241h, and the valve 243h.

For example, silicon source gas, namely gas containing silicon (Si) (silicon-containing gas) is supplied into the processing chamber 201 from the first gas supply tube 232a through the mass flow controller 241a, the valve 243a, and the first nozzle 249a. For example, hexachloro disilane ($Si_2Cl_6$, abbreviated as HCD) can be used as the silicon-containing gas. Note that when a liquid source in a liquid state at a normal temperature and under normal pressure such as HCD is used, the liquid source is vaporized by a vaporizer or a vaporization system such as a bubbler, and is supplied as the source gas.

Gas containing carbon (C) for example, is supplied into the processing chamber 201 from the second gas supply tube 232b through the mass flow controller 241b, the valve 243b, and the second nozzle 249b. For example, propylene ($C_3H_6$) gas can be used as the carbon-containing gas.

For example, gas containing nitrogen (N) (nitrogen-containing gas) is supplied into the processing chamber 201 through the mass flow controller 241c, the valve 243c, and the third nozzle 249c from the third gas supply tube 232c. For example, ammonia ($NH_3$) gas can be used as the nitrogen-containing gas.

For example, gas containing oxygen (O) (oxygen-containing gas) is supplied into the processing chamber 201 from the fourth gas supply tube 232d through the mass flow controller 241d, the valve 243d, the fourth nozzle 249d, and the buffer chamber 237 from the fourth gas supply tube 232d. For example, oxygen ($O_2$) gas and nitrous oxide ($N_2O$) can be used as the oxygen-containing gas.

For example, gas containing fluorine (F) (fluorine-containing gas) as the cleaning gas, is supplied into the processing chamber 201 from the fifth gas supply tube 232i through the mass flow controller 241i, the valve 243i, and the first nozzle 249a. For example, nitrogen fluoride ($NF_3$) gas, fluorine ($F_2$) gas, chlorine fluoride ($ClF_3$) gas, and hydrogen fluorine (HF) gas, etc., can be used as the cleaning gas.

For example, gas containing hydrogen (H) (hydrogen-containing gas) is supplied into the processing chamber 201 from the sixth gas supply tube 232j through the mass flow controller 241j, the valve 243j, the fourth nozzle 249d, and the buffer chamber 237. For example, hydrogen ($H_2$) can be used as the hydrogen-containing gas.

For example, nitrogen ($N_2$) gas is supplied into the processing chamber 201 form inert gas supply tubes 232e, 232f, 232g, and 232h through mass flow controllers 241e, 241f, 241g, 241h, valves 243e, 243f, 243g, 243h, gas supply tubes 232a, 232b, 232c, 232d, gas nozzles 249a, 249b, 249c, 249d, and the buffer chamber 237.

Note that when the aforementioned gas is flowed from each gas supply tube, a source gas supply system is constructed by the first gas supply system, namely silicon-containing gas supply system (silane-based gas supply system) is constructed. Further, a carbon-containing gas supply system is constructed by the second gas supply system. Moreover, a nitrogen-containing gas supply system is constructed by the third gas supply system. Further, an oxygen-containing gas supply system is constructed by the fourth gas supply system. In addition, a cleaning gas supply system is constructed by the fifth gas supply system. Moreover, a hydrogen-containing gas supply system is constructed by the sixth gas supply system. Note that a source gas supply system is simply called a source supply system. Further, when the carbon-containing gas, the nitrogen-containing gas, the oxygen-containing gas, and the hydrogen-containing gas are generally called a reaction gas, a reaction gas supply system is constructed by the carbon-containing gas supply system, the hydrogen-containing gas supply system, the nitrogen-containing gas supply system, and the oxygen-containing gas supply system.

As shown in FIG. 2, first rod type electrodes being first electrodes and second rod type electrodes being second electrodes having long and thin shapes, are arranged in the laminating direction of the wafer 200 extending from the lower part to the upper part of the reaction tube 203. Each of the first rod type electrodes 269 and the second rod type electrodes 270 is provided in parallel to the fourth nozzle 249d. Each of the first rod type electrodes 269 and the second rod type electrodes 270 is covered and protected by an electrode protective tube 275 being the protective tube for protecting each electrode extending from the upper part to the lower part. Either one of the first rod type electrode 269 and the second rod type electrode 270 is connected to a high frequency power source 273 via a matching box 272, and the other one is connected to earth being a reference electric potential. As a result, plasma is generated in a plasma generation area 224 between the first rod type electrode 269 and the second rod type electrode 270. A plasma source is mainly constituted of the first rod type electrodes 269, the second rod type electrodes 270, the electrode protective tube 275, the matching box 272, and the high frequency power source 273, as a plasma generator (plasma generation part). Note that as will be described later, the plasma source functions as an activation mechanism of activating the gas by plasma.

The electrode protective tube 275 is configured to insert each of the first rod type electrodes 269 and the second rod type electrodes 270, into the buffer chamber 237 in a state of being isolated from an atmosphere of the buffer chamber 237. Wherein, if the inside of the electrode protective tube 275 is set in the same atmosphere as outside air (atmosphere air), the first rod type electrodes 269 and the second rod type electrodes 270 inserted into the electrode protective tube 275 respectively are oxidized by a heat of the heater 207. Therefore, an inert gas purge mechanism is provided inside of the electrode protective tube 275, for filling or purging the inside with inert gas to thereby sufficiently suppress an oxygen concentration and prevent oxidation of the first rod type electrodes 269 or the second rod type electrodes 270.

An exhaust tube 231 for exhausting the atmosphere of the processing chamber 201 is provided in the reaction tube 203. A vacuum pump 246 being a vacuum exhaust device is connected to the exhaust tube 231 through a pressure sensor 245 being a pressure detector (pressure detection part) for detecting a pressure in the processing chamber 201 and an APC (Auto Pressure Controller) valve 244 being a pressure adjuster (pressure adjustment part), to thereby achieve a vacuum-exhaust of the inside of the processing chamber 201 and obtain a prescribed pressure (degree of vacuum) inside of the processing chamber 201. Note that the APC valve 244 is an open/close valve capable of vacuum-exhaust or stop of the inside of the processing chamber 201 by opening and closing a valve, and is capable of adjusting the pressure by adjusting a valve opening degree. An exhaust system is mainly constituted of the exhaust tube 231, the APC valve 244, the vacuum pump 246, and the pressure sensor 245.

A seal cap 219 being a furnace throat lid member capable of air-tightly closing a lower end opening of the reaction tube 203, is provided in a lower part of the reaction tube 203. The seal cap 219 is abutted on the lower end of the reaction tube 203 from a vertically lower side. The seal cap 219 is made of metal such as stainless for example, and is formed in a disc-shape. An O-ring 220 being a seal member abutted on the lower end of the reaction tube 203, is provided on an upper surface of the seal cap 219. A rotation mechanism 267 for rotating a boat, is installed on an opposite side to the processing chamber 201 of the seal cap 219. A rotary shaft 255 of the rotation mechanism 267 is passed through the seal cap 219 and is connected to a boat 217 as will be described later, so that the boat 217 is rotated, to thereby rotate the wafer 200. The seal cap 219 is configured to be vertically elevated or lowered by a boat elevator 115 being an elevation mechanism vertically installed outside of the reaction tube 203. Thus, the boat 217 can be loaded and unloaded into/from the processing chamber 201.

The boat 217 being a substrate supporting tool, is made of a heat resistant material such as quartz and silicon carbide, and is configured to support a plurality of wafers in a horizontal posture, in a state of being arranged in multiple stages with centers thereof aligned with each other. Note that a heat insulating member 218 made of a heat resistant material such as quartz and silicon carbide, is provided in the lower part of the boat 217, so that the heat from the heater 207 is hardly transmitted to the side of the seal cap 219. Note that the heat insulating member 218 may also be constituted by a plurality of heat insulating plates made of the heat resistant material such as quartz and silicon carbide, and a heat insulating holder for supporting them in the horizontal posture in multiple stages.

A temperature sensor 263 being a temperature detector is installed in the reaction tube 203, so that the temperature in the processing chamber 201 has a desired temperature distribution by adjusting a power supply state to the heater 207 based on temperature information detected by the temperature sensor 263. Similarly to the nozzles 249a, 249b, 249c, and 249d, the temperature sensor 263 is formed into the L-shape, and is provided along the inner wall of the reaction tube 203.

A controller 121 being a control part (control unit) is connected to the mass flow controllers 241a, 241b, 241c, 241e, 241f, 241g, 241h, 241i, 241j, and valves 243a, 243b, 243c, 243d, 243e, 243f, 243h, 243i, 243j, and pressure sensors 245, APC valve 244, vacuum pump 246, heater 207, temperature sensor 263, rotation mechanism 267, boat elevator 115, high frequency power source 273, and matching box 272, etc. The controller 121 controls a flow adjusting operation of each kind of gas using the mass flow controllers 241a, 241b, 241c, 241d, 241e, 241f, 241g, 241h, 241i, 241j, an opening/closing operation of the valves 243a, 243b, 243c, 243d, 243e, 243f, 243g, 243h, 243i, 243j, a pressure adjusting operation based on the open/close of the APC valve 244 and the pressure sensor 245, a temperature adjusting operation of the heater 207 based on the temperature sensor 263, start/stop of the vacuum pump 246, a rotation speed adjusting operation of the rotation mechanism 267, an elevating operation of the boat elevator 115, electric power supply of the high frequency power source 273, and impedance of the matching box 272.

(2) Film Forming Step

Figure 3:
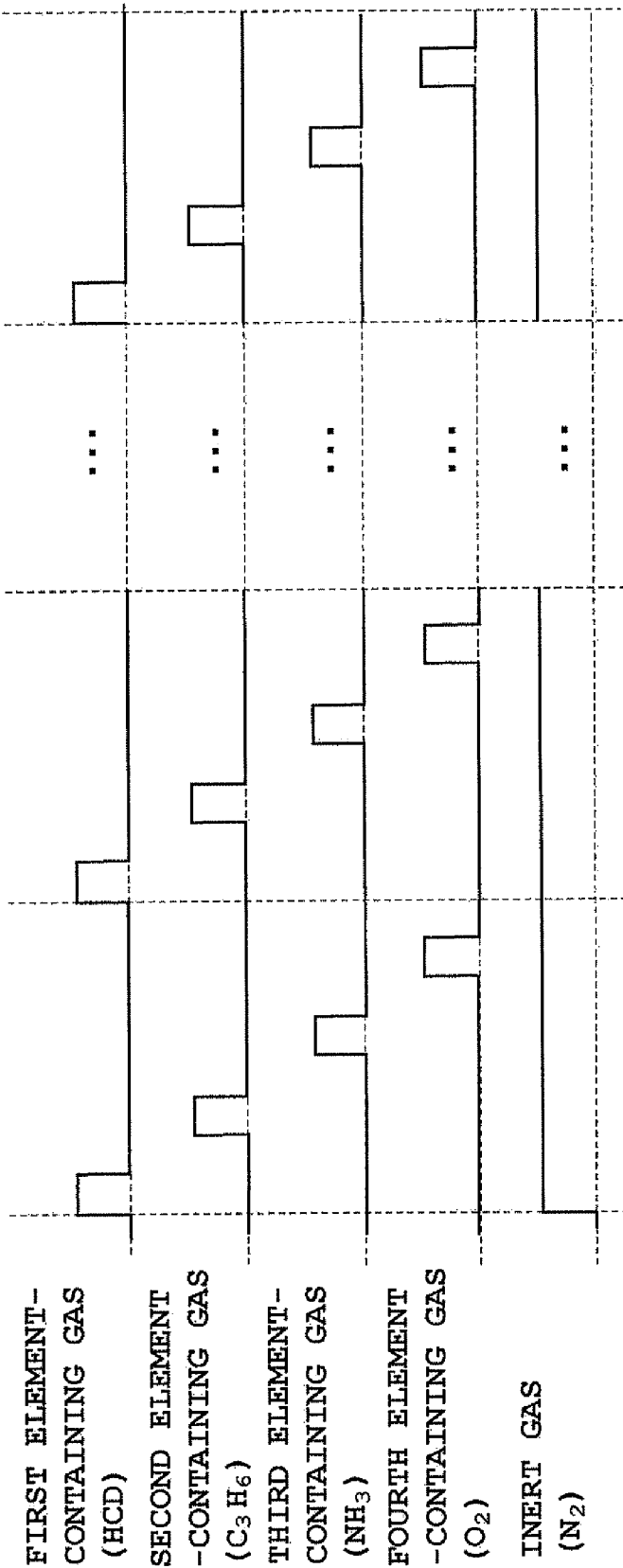
FIG. 3 is a view showing a timing of supplying gas in a film forming step of this embodiment.

Next, explanation will be given for an example of forming a silicon nitrocarbide film (SiOCN film) being an insulation film on the substrate, as one of the manufacturing steps of the semiconductor device using a processing furnace of the substrate processing apparatus. Note that in the explanation given hereafter, the operation of each part constituting the substrate processing apparatus is controlled by the controller 121. FIG. 3 is a timing chart of supplying gas in the film forming step of this embodiment.

In this embodiment, the silicon nitrocarbide film having a prescribed film thickness is formed on the wafer 200, by performing the step of forming the silicon-containing layer on the wafer 200 by supplying the silicon-containing gas under a condition that a CVD reaction occurs in the processing vessel in which the wafer 200 is housed, the step of forming a carbon-containing layer on the silicon-containing layer by supplying carbon-containing gas into the processing vessel to thereby form a layer containing silicon and carbon, the step of forming a silicon carbonitride layer by nitriding a layer containing silicon and carbon by supplying nitrogen-containing gas into the processing vessel; and the step of forming a silicon oxycarbonitride layer by oxidizing the silicon carbonitride layer by supplying an oxygen-containing gas into the processing vessel, with these steps as one cycle, and performing this cycle prescribed number of times (one or more).

The substrate processing step according to this embodiment will be specifically described hereafter. Note that here, explanation will be given for an example of forming the silicon oxycarbonitride film (SiOCN film) on the wafer 200 as the insulating film based on a sequence of FIG. 3, using HCS gas being the silicon-containing gas as a first element-containing gas, $C_3H_6$ gas being the carbon-containing gas as a second element-containing gas, $NH_3$ gas being the nitrogen-containing gas as a third element-containing gas, and $O_2$ gas being the oxygen-containing gas as a fourth element-containing gas. Note that in this example, silicon-containing gas supply system (first element-containing gas supply system) is constructed by the first gas supply system, and a carbon-containing gas supply system (second element-containing gas supply system) is constructed by the second gas supply system, a nitrogen-containing gas supply system (third element-containing gas supply system) is constructed by the third gas supply system, and an oxygen-containing gas supply system (fourth element-containing gas supply system) is constructed by the fourth gas supply system.

When a plurality of wafers 200 are charged into the boat 217 (wafer charge), as shown in FIG. 1, the boat 217 supporting the plurality of wafers 200 is lifted by the boat elevator 115, and is loaded into the processing chamber 201 (boat loading). In this state, the seal cap 219 is set in a state of sealing the lower end of the reaction tube 203 through the O-ring 220.

The inside of the processing chamber 201 is vacuum-exhausted by the vacuum pump 246 so as to be a desired pressure (degree of vacuum). At this time, the pressure in the processing chamber 201 is measured by the pressure sensor 245, and based on the pressure information thus measured, the APC valve 244 is feedback-controlled (pressure adjustment). Further, the inside of the processing chamber 201 is heated by the heater 207 to be a desired temperature. At this time, the power supply state to the heater 207 is feedback-controlled base on the temperature information detected by the temperature sensor 263, so that a desired temperature distribution is obtained in the processing chamber 201 (temperature adjustment). Subsequently, the wafer 200 is rotated by rotating the boat 217 by the rotation mechanism 267 (wafer rotation). Thereafter, four steps as will be described later, are sequentially executed.

[Step 1]

The valve 243a of the first gas supply tube 232a is opened, to flow the HCD gas into the first gas supply tube 232a. The flow rate of the HCD gas flowing into the first gas supply tube 232a is adjusted by the mass flow controller 241a. The HCD gas with the flow rate adjusted, is supplied into the processing chamber 201 from the gas supply holes 250a of the first nozzle 249a, and is exhausted through the exhaust tube 231. At this time, the valve 243e is simultaneously opened, to flow the inert gas such as $N_2$ gas into the first inert gas supply tube 232e. The flow rate of the $N_2$ gas flowing into the first inert gas supply tube 232e, is adjusted by the mass flow controller 241e. The $N_2$ gas with the flow rate adjusted, is supplied into the processing chamber 201 together with the HCD gas, and is exhausted through the exhaust tube 231.

At this time, the APC valve 244 is properly adjusted, to set the pressure in the processing chamber 201 to the pressure in a range of 10 to 1000 Pa for example. Supply flow rate of the HCD gas controlled by the mass flow controller 241a is set to the flow rate in a range of 10 to 1000 sccm for example. The supply flow rate of the $N_2$ gas controlled by the mass flow controller 241e is the flow rate set in a range of 200 to 2000 sccm for example. The time required for exposing the HCD gas to the wafer 200, namely a gas supply time (irradiation time) is set in a range of 1 to 120 seconds for example. At this time, the temperature of the heater 207 is set to the temperature for generating the CVD reaction in the processing chamber 201, namely set to the temperature allowing the temperature of the wafer 200 to be in a range of 300 to 650° C. for example. Note that when the temperature of the wafer 200 is less than 300° C., HCD is hardly adsorbed on the wafer 200. Further, when the temperature of the wafer 200 exceeds 650° C., strong CVD reaction occurs, thus deteriorating the uniformity. Therefore, the temperature of the wafer 200 is preferably set in a range of 300 to 650° C.

Owing to the supply of the HCD gas, a first layer containing silicon as a first element, is formed on a base film on the surface of the wafer 200. Namely, a silicon layer (Si layer) being the silicon-containing layer of less than 1 atomic layer to several atomic layer, is formed on the wafer 200 (on the base film). The silicon-containing layer may be a chemical adsorption layer of HCD. Note that silicon is an element which is a solid by itself. Here, the silicon layer includes not only a continuous layer made of silicon, but also a discontinuous layer and a thin film formed by overlap of them. Note that the discontinuous layer made of silicon is called the thin film in some cases. Further, the chemical adsorption layer of HCD includes not only a discontinuous chemical adsorption layer composed of HCS molecules, but also a discontinuous chemical adsorption layer. Note that the layer of less than 1 atomic layer means an atomic layer formed discontinuously. When the thickness of the silicon-containing layer formed on the wafer 200 exceeds several atomic layer, a nitriding function in step 3 as will be described later, does not cover the entire body of the silicon-containing layer. Moreover, a minimum value of the silicon-containing layer that can be formed on the wafer 200 is less than 1 atomic layer. Therefore, preferably the silicon-containing layer has the thickness of less than 1 atomic layer to several atomic layer. In addition, a silicon layer is formed by depositing silicon on the wafer 200 under a condition that the HCD gas is self-decomposed, and the chemical adsorption layer of HCD is formed by chemically adsorbing the HCD on the wafer 200 under a condition that the HCD gas is not self-decomposed. Note that it is more preferable to form the silicon layer on the wafer 200 than to form the chemical adsorption layer of HCD on the wafer 200, because a film formation rate can be increased.

After the silicon-containing layer is formed, the valve 243a is closed to stop the supply of the HOD gas. At this time, the APC valve 244 of the exhaust tube 231 is remained to be opened, to vacuum-exhaust the inside of the processing chamber 201 by the vacuum pump 246, so that unreacted HOD gas or the HCD gas after contributing to forming the silicon-containing layer remained in the processing chamber 201, is removed from the inside of the processing chamber 201. At this time, the valve 243e is remained to be opened, thus maintaining the supply of the $N_2$ gas into the processing chamber 201. Accordingly, an effect of removing the HCD gas from the processing chamber 201 can be increased, which is the HOD gas unreacted or after contributing to forming the silicon-containing layer and remained in the processing chamber 201.

As the silicon-containing gas, it is acceptable to use not only inorganic raw materials such as tetrachlorosilane ($SiCl_4$, abbreviated as STC) gas, trichlorosilane ($SiHCl_3$, abbreviated as TCS) gas, dichlorosilane ($SiH_2Cl_2$, abbreviated as DCS) gas, monochlorosilane ($SiH_3Cl$, abbreviated as MCS) gas, monosilane ($SiH_4$) gas, but also organic raw materials such as aminosilane-based tetrakis dimethyl aminosilane (Si[N($CH_3$)$_2$]$_4$, abbreviated as 4DMAS) gas, tris dimethyl aminosilane (Si[N($CH_3$)$_2$]$_3$H, abbreviated as 3DMAS) gas, bis-ethyl aminosilane (Si[N($C_2H_5$)$_2$]$_2H_2$, abbreviated as 2DEMA) gas, and bis tertuart bytyl aminosilane (Si$H_2$[NH($C_4H_9$)]$_2$, abbreviated as BTBAS) gas, in addition to the HCD gas. As the inert gas, it is also acceptable to use rare gas such as Ar gas, He gas, No gas, and Xe gas, in addition to the $N_2$ gas.

[Step 2]

After step 1 is ended and residual gas in the processing chamber 201 is removed, the valve 243b of the second gas supply tube 232b is opened, to flow $C_3H_6$ gas into the second gas supply tube 232b. The flow rate of the $C_3H_6$ gas flowed into the second gas supply tube 232b, is adjusted by the mass flow controller 241b. The $C_3H_6$ gas with the flow rate adjusted, is supplied into the processing chamber 201 from the gas supply holes 250b of the second nozzle 249b, and is exhausted through the exhaust tube 231. The $C_3H_6$ gas supplied into the processing chamber 201 is thermally activated. At this time, the valve 243f is simultaneously opened, to flow the $N_2$ gas into the inert gas supply tube 232f. The $N_2$ gas is supplied into the processing chamber together with the $C_3H_6$ gas, and is exhausted through the exhaust tube 231.

At this time, the APC valve 244 is properly adjusted, to thereby set the pressure in the processing chamber 201 in a range of 50 to 3000 Pa for example. Supply flow rate of the $C_3H_6$ gas controlled by the mass flow controller 241*b* is set within a range of 100 to 10000 sccm for example. The supply flow rate of the $N_2$ gas controlled by the mass flow controller 241*f* is set in a range of 200 to 2000 sccm for example. At this time, a partial pressure of the $C_3H_6$ gas in the processing chamber 201 is set within a range of 6 to 2940 Pa. The time for exposing the $C_3H_6$ gas to the wafer 200, namely the gas supply time (irradiation time) is set in a range of 1 to 120 seconds for example. The temperature of the heater 207 is set so that the temperature of the wafer 200 is in a range of 300 to 650° C., similarly to step 1. Note that a soft reaction can be caused to occur by supplying the $C_3H_6$ gas in a state of being thermally activated, and a carbon-containing layer as will be described later can be easily formed.

At this time, the gas flowed into the processing chamber 201 is thermally activated $C_3H_6$ gas, and the HCD gas is not flowed into the processing chamber 201. Accordingly, the thermally activated $C_3H_6$ gas is supplied to the wafer 200 without causing a vapor phase reaction. At this time, the carbon-containing layer of less than 1 atomic layer, namely the discontinuous carbon-containing layer is formed on the silicon-containing layer formed on the wafer 200 in step 1. Thus, a second layer containing silicon (first element) and carbon (second element) is formed. Note that a part of the silicon-containing layer and the $C_3H_6$ gas are reacted depending on the condition, to thereby modify (carbonize) the silicon-containing layer, and the second layer containing silicon and carbon is formed in some cases.

The carbon-containing layer formed on the silicon-containing layer, may be a carbon layer (C-layer) or a chemical adsorption layer of $C_3H_6$, namely the chemical adsorption layer of $C_xH_y$ (substance after $C_3H_6$ is decomposed). Here, the carbon layer needs to be formed as a discontinuous layer composed of carbon. Further, the chemical adsorption layer of $C_xH_y$ needs to be formed as a discontinuous chemical adsorption layer composed of $C_xH_y$ molecules. Note that when the carbon-containing layer is formed on the silicon-containing layer as a continuous layer, for example when a continuous chemical adsorption layer of $C_xH_y$ is formed on the silicon-containing layer in a saturated state of adsorption of $C_xH_y$ on the silicon-containing layer, the surface of the silicon-containing layer is covered with the chemical adsorption layer of $C_xH_y$ entirely. In this case, silicon is not present on the surface of the second layer, thus making it difficult to cause the nitriding reaction of the second layer to occur in step 3 as will be described later. This is because nitrogen is bonded to silicon but is not bonded to carbon. In order to allow a desired nitriding reaction to occur in step 3 as will be described later, silicon needs to be in an exposed state to the surface of the second layer in the unsaturated state of adsorption of $C_xH_y$ on the silicon-containing layer of $C_xH_y$.

In addition, in order to set the adsorption state of $C_xH_y$ on the silicon-containing layer in the unsaturated state, the aforementioned processing condition is used as the processing condition in step 2, and further by using the following processing condition as the processing condition in step 2, it becomes easy to set the adsorption state of $C_xH_y$ on the silicon-containing layer in the unsaturated state.

Wafer temperature: 500 to 630° C.
Pressure in the processing chamber: 133 to 2666 Pa
Partial pressure of $C_3H_6$ gas: 67 to 2820 Pa
Supply flow rate of $C_3H_6$ gas: 1000 to 5000 sccm
Supply flow rate of $N_2$ gas: 300 to 1000 sccm
Supply flow rate of $C_3H_6$ gas: 6 to 100 seconds Thereafter, the valve 243*b* of the second gas supply tube 232*b* is closed, to stop the supply of the $C_3H_6$ gas. At this time, the APC valve 244 of the exhaust tube 231 is remained to be opened, to vacuum-exhaust the inside of the processing chamber 201 by the vacuum pump 246, so that the unreacted $C_3H_6$ gas or the $C_3H_6$ gas after contributing to forming the carbon-containing layer remained in the processing chamber 201, is removed from the processing chamber 201. Note that at this time, supply of the $N_2$ gas into the processing chamber 201 is maintained, with the valve 243*f* opened. Thus, the effect of removing the $C_3H_6$ gas unreacted or contributing to forming the carbon-containing layer remained in the processing chamber 201, can be increased.

As the carbon-containing gas, acetylene ($C_2H_2$) gas or ethylene ($C_2H_4$) gas, etc., may also be used other than $C_3H_6$ gas.

[Step 3]

The residual gas in the processing chamber 201 is removed, and thereafter the valve 243*c* of the third gas supply tube 232*c* is opened, to flow the $NH_3$ gas into the third gas supply tube 232*c*. The flow rate of the $NH_3$ gas flowed into the third gas supply tube 232*c* is adjusted by the mass flow controller 241*c*. The $NH_3$ gas with the flow rate adjusted, is supplied into the processing chamber 201 from the gas supply holes 250*c* of the third nozzle 249*c*, and is exhausted through the exhaust tube 231. Note that the $NH_3$ gas supplied into the processing chamber 201 is thermally activated. At this time, the valve 243*g* is opened simultaneously to flow the $N_2$ gas into the inert gas supply tube 232*g*. The $N_2$ gas is supplied into the processing chamber 201 together with the $NH_3$ gas, and is exhausted through the exhaust tube 231.

When the $NH_3$ gas is activated and flowed, the APC valve 244 is properly adjusted, to set the pressure in the processing chamber 201 in a range of 50 to 3000 Pa for example. The supply flow rate of the $NH_3$ gas controlled by the mass flow controller 241*c* is set in a range of 100 to 10000 sccm for example. The supply flow rate of the $N_2$ gas controlled by the mass flow controller 241*g* is set in a range of 200 to 2000 sccm for example. At this time, the partial pressure of the $NH_3$ gas in the processing chamber 201 is set in a range of 6 to 2940 Pa. The time for exposing the $NH_3$ gas to the wafer 200, namely the gas supply time (irradiation time) is set in a range of 1 to 120 seconds for example. At this time, the temperature of the heater 207 is set so that the temperature of the wafer 200 is within a range of 300 to 650° C. Since the $NH_3$ gas has a high reaction temperature and is hardly reacted at the aforementioned wafer temperature, the pressure in the processing chamber 201 is set to a relatively higher temperature so that the $NH_3$ gas can be thermally activated. Note that, a soft reaction is caused by supplying the thermally activated $NH_3$ gas, and nitrization as will be described later can be carried out softly.

At this time, the gas flowed into the processing chamber 201 is the thermally activated $NH_3$ gas, and neither the HCD gas nor the $C_3H_6$ gas is flowed into the processing chamber 201. Accordingly, the thermally activated $NH_3$ gas is reacted with a part of a layer including silicon and carbon, being the second layer formed on the wafer 200 in step 2, without causing the vapor phase reaction. Thus, the second layer is thermally nitrided in a state of non-plasma, and is changed (modified) to a third layer containing silicon (first element), carbon (second element), and nitrogen (third element), namely a silicon carbonitride layer (SiCN layer).

At this time, a nitriding reaction of the second layer is not allowed to be saturated. For example, when the silicon layer of several atomic layers is formed in step 1, and a carbon-containing layer of less than 1 atomic layer is formed in step 2, a part of its surface layer (1 atomic layer of the surface) is nitrided. Namely, apart or the whole part of an area of the surface layer where nitridation possibly occurs (the area where silicon is exposed) is nitrided. In this case, nitridation is carried out under a condition that the nitriding reaction of the second layer is not saturated so as not to nitride the whole body of the second layer. Note that lower several layers from the surface layer of the second layer can be nitrided depending on the condition. However, it is more preferable to nitride only the surface layer, because controllability of a composition ratio of the silicon carbonitride film can be improved. Further, in a case of forming the silicon layer of 1 atomic layer or less than 1 atomic layer in step 1, and forming the carbon-containing layer of less than 1 atomic layer in step 2, apart of its surface layer is similarly nitrided. In this case as well, the nitridation is carried out under a condition that the nitriding reaction of the second layer is unsaturated so that the whole body of the second layer is not nitrided.

Note that in order to make the nitriding reaction of the second layer unsaturated, the aforementioned processing condition is used as the processing condition in step 3. However, the nitriding reaction of the second layer is easily unsaturated by using the following processing condition as the processing condition in step 3.

Wafer temperature: 500 to 630° C.
Pressure in the processing chamber: 133 to 2666 Pa
$NH_3$ gas partial pressure: 67 to 2820 Pa
$NH_3$ gas supply flow rate: 1000 to 5000 sccm
$N_2$ gas supply flow rate: 300 to 1000 sccm
$NH_3$ gas supply time: 6 to 100 seconds Thereafter, the valve 243c of the third gas supply tube 232c is closed to stop the supply of the $NH_3$ gas. At this time, the APC valve 244 of the exhaust tube 231 is remained to be opened, to thereby vacuum-exhaust the inside of the processing chamber 201 by the vacuum pump 246, and remove the unreacted $NH_3$ gas or the $NH_3$ gas after contributing to the nitridation remained in the processing chamber 201, from the processing chamber 201. Note that the supply of the $N_2$ gas into the processing chamber 201 is maintained, with the valve 243g opened at this time. Thus, the effect of removing the unreacted $NH_3$ gas or the $NH_3$ gas after contributing to the nitridation remained in the processing chamber 201, can be increased.

As the nitrogen-containing gas, diazine ($N_2H_2$) gas, hydrazine ($N_2H_4$) gas, and $N_3H_8$ gas, etc., may be used, other than the $NH_3$ gas.

[Step 4]

After the residual gas in the processing chamber 201 is removed, the valve 243d of the fourth gas supply tube 232d and the valve 243h of the fourth inert gas supply tube 232h are opened, to flow $O_2$ gas into the fourth gas supply tube 232d, and flow $N_2$ gas into the fourth inert gas supply tube 232h. The flow rate of the $N_2$ gas flowed into the fourth inert gas supply tube 232h is adjusted by the mass flow controller 241h. The flow rate of the $O_2$ gas flowed into the fourth gas supply tube 232d is adjusted by the mass flow controller 241d. The $O_2$ gas with the flow rate adjusted, is mixed with the $N_2$ gas with the flow rate adjusted in the fourth gas supply tube 232d, and is supplied into the buffer chamber 237 from the gas supply holes 250d of the fourth nozzle 249d. At this time, high frequency power is not applied between the first rod-type electrodes 269 and the second rod-type electrodes 270. Thus, the $O_2$ gas supplied into the buffer chamber 237 is thermally activated, and is supplied into the processing chamber 201 from the gas supply holes 250e and is exhausted through the exhaust tube 231. At this time, the $O_2$ gas supplied into the buffer chamber 237 can also be activated by plasma, by applying the high frequency power between the first rod-type electrodes 269 and the second rod-type electrodes 270.

When the $O_2$ gas is thermally activated and flowed, the APC valve 244 is properly adjusted, to set the pressure in the processing chamber 201 in a range of 1 to 3000 Pa for example. The supply flow rate of the $O_2$ gas controlled by the mass flow controller 241d is set in a range of 100 to 5000 sccm (0.1 to 5 slm) for example. The supply flow rate of the $N_2$ gas controlled by the mass flow controller 241h is set in a range of 200 to 2000 sccm for example. At this time, the partial pressure of the $O_2$ gas in the processing chamber 201 is set in a range of 6 to 2940 Pa. The time for exposing the $O_2$ gas to the wafer 200, namely the gas supply time (irradiation time) is set in a range of 1 to 120 seconds for example. At this time, similarly to steps 1 to 3, the temperature of the heater 207 is set so that the temperature of the wafer 200 is in a range of 300 to 650° C. The $O_2$ gas is thermally activated under the following condition. Note that the $O_2$ gas can be softly reacted by being supplied in a thermally activated state, At this time, the gas flowed into the processing chamber 201 is the thermally activated $O_2$ gas, and the HCD gas, $C_3H_6$ gas, $NH_3$ gas are not flowed into the processing chamber 201. Accordingly, the activated $O_2$ gas is reacted with at least a part of the SiCN layer, being the third layer formed on the wafer 200 in step 3, without causing the vapor phase reaction. Thus, the SiCN layer is thermally oxidized in a state of non-plasma, and is changed (modified) to the fourth layer, namely the silicon carbonitride layer (SiOCN layer) containing silicon (first element), carbon (second element), nitrogen (third element), and oxygen (fourth element).

At this time, an oxidizing reaction of the SiCN layer is not allowed to be saturated. For example, when the SiCN layer of several atomic layers is formed in steps 1 to 3, at least a part of its surface layer (1 atomic layer of the surface) is oxidized. In this case, oxidation is carried out under a condition that the oxidizing reaction of the SiCN layer is unsaturated so that the whole body of the SiCN layer is not oxidized. Note that although lower several layers from the surface layer of the SiCN layer can also be oxidized depending on the condition, preferably the controllability of the composition ratio of the SiOCN film can be improved by oxidizing only the surface layer. Further, when the SiCN layer of 1 atomic layer or less than 1 atomic layer is formed insteps 1 to 3 for example, a part of its surface layer is similarly oxidized. In this case as well, the oxidation is carried out under the condition that the oxidizing reaction of the SiCN layer is unsaturated so that the whole body of the SiCN layer is not oxidized.

In order to make the oxidizing reaction of the SiCN layer (third layer) unsaturated, the aforementioned processing condition is used as the processing condition in step 4. However, by using the following processing condition as the processing condition in step 4, it becomes easy to set the oxidizing reaction of the SiCN layer in the unsaturated state.

Wafer temperature: 500 to 630° C.
Pressure in the processing chamber: 133 to 2666 Pa
Partial pressure of $O_2$ gas: 67 to 2820 Pa
Supply amount of $O_2$ gas: 1000 to 5000 sccm
Supply amount of $N_2$ gas: 300 to 1000 sccm
Supply amount of $O_2$ gas: 6 to 100 seconds Thereafter, the valve 243d of the fourth gas supply tube 232d is closed to stop the supply of the $O_2$ gas. At this time, the inside of the processing chamber 201 is vacuum-exhausted by the vacuum pump 246, with the APC valve 244 of the exhaust tube 231 opened, so that the unreacted $O_2$ gas or the $O_2$ gas after contributing to the oxidation remained in the processing chamber 201, is removed from the processing chamber 201. At this time, the supply of the $N_2$ gas into the processing chamber 201 is maintained, with the valve 243h opened. Thus, the effect of removing the unreacted $O_2$ gas or the $O_2$ gas after contributing to the oxidation remained in the processing chamber 201, can be increased.

As the oxygen-containing gas, vapor ($H_2O$) gas, nitric monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, $H_2$ gas+$O_2$ gas, $H_2$ gas+$O_3$ gas, etc., may be used, other than the $O_2$ gas.

The aforementioned steps 1 to 4 are set as 1 cycle, and by carrying out this cycle prescribed number of times, a thin film having a prescribed film thickness and containing silicon (first element), carbon (second element), nitrogen (third element), and oxygen (fourth element), namely the silicon carbonitride film (SiOCN film) can be formed on the wafer 200. Note that the aforementioned cycle is preferably carried out multiple number of times.

When the film formation processing is performed for forming the silicon carbonitride film having the prescribed film thickness, the inert gas such as $N_2$ is supplied into the processing chamber 201 and is exhausted, to thereby purge the inside of the processing chamber 201 with the inert gas (gas purge). Thereafter, atmosphere in the processing chamber 201 is replaced by the inert gas (substitution with inert gas), and the pressure in the processing chamber 201 is returned to a normal pressure (returned to an atmospheric pressure).

Thereafter, the seal cap 219 is lowered by the boat elevator 115, to open the lower end of the reaction tube 203, so that the processed wafer 200 is unloaded to outside of the reaction tube 203 from the lower end of the reaction tube 203 in a state of being supported by the boat 217 (boat unload). Thereafter, the processed wafer is discharged from the boat 217 (wafer discharge).

In addition, steps 1 to 3 are set as 1 cycle, and by carrying out this cycle prescribed number of times, the thin film containing silicon (first element), carbon (second element) and nitrogen (third element), namely the silicon carbonitride film (SiCN film) having the prescribed film thickness can also be formed on the wafer 200. In this case as well, preferably the aforementioned cycle is carried out multiple number of times. Further, steps 1 to 3 are set as 1 cycle, and by carrying out this cycle prescribed number of times, the thin film containing silicon (first element) and nitrogen (third element), namely the silicon nitride film (SiN film) having a prescribed thickness can be formed on the wafer 200. In this case as well, preferably the aforementioned cycle is carried out multiple number of times.

(3) Cleaning Step

A method for cleaning the inside of the processing chamber 201 will be described next. Note that in the following explanation as well, the operation of each part constituting the substrate processing apparatus is controlled by the controller 121.

By repeating the aforementioned film forming step, the thin film of SiOCN, SiCN, and SiN, etc., is accumulated on the inner wall of the reaction tube 203 in the processing chamber 201. Namely, the deposit including the thin film is adhered to the inner wall, etc. Cleaning of the inside of the processing chamber 201 is performed when the thickness of the deposit (accumulated thin film) adhered to the inner wall, etc., reaches a prescribed thickness before peel-off or drop of the deposit occurs. The cleaning is performed by supplying $F_2$ gas solely or the $F_2$ gas diluted with the inert gas solely as the cleaning gas, into the processing chamber 201 heated at a prescribed temperature, to thereby remove the thin film deposited (accumulated) in the processing chamber 201. The cleaning step is specifically described hereafter.

An empty boat 217, namely the boat 217 with no wafer 200 charged therein, is lifted by the boat elevator 115 and is loaded into the processing chamber 201 (boat load). In this state, the lower end of the reaction tube 203 is set in a sealed state by the seal cap 219 through the O-ring 220.

The inside of the processing chamber 201 is vacuum-exhausted to be a desired pressure (degree of vacuum) by the vacuum pump 246. At this time, the pressure in the processing chamber 201 is measured by the pressure sensor 245, and based on the measured pressure information, the APC valve 244 is feedback-controlled. Further, the inside of the processing chamber 201 is heated to a desired temperature by the heater 207. At this time, a power supply condition to the heater 207 is feedback-controlled based on the temperature information detected by the temperature sensor 263, so that the temperature in the processing chamber 201 has a desired temperature distribution. When the pressure and the temperature in the processing chamber 201 reaches a desired pressure and a desired temperature respectively, the pressure and the temperature are controlled to be maintained as they are. Subsequently, the boat 217 is rotated by the rotation mechanism 267. Note that the boat 217 may not be rotated.

Subsequently, the valve 243$i$ of the fifth gas supply tube 232$i$ is opened in a state of maintaining the prescribed temperature and the prescribed pressure respectively, to flow the $F_2$ gas into the fifth gas supply tube 232$i$. The flow rate of the $F_2$ gas flowed into the fifth gas supply tube 232$i$ is adjusted by the mass flow controller 241$i$. The $F_2$ gas with the flow rate adjusted, flows into the first gas supply tube 232$a$ and is supplied into the processing chamber 201 from the gas supply holes 250$a$ of the first nozzle 249$a$ and is exhausted from the exhaust tube 231.

At this time, it is also acceptable that the valve 243$e$ is simultaneously opened, to flow the inert gas such as $N_2$ gas into the first inert gas supply tube 232$e$, so that the $F_2$ gas being the cleaning gas is diluted. The flow rate of the $N_2$ gas flowed into the first inert gas supply tube 232$e$ is adjusted by the mass flow controller 241$e$. The $N_2$ gas with the flow rate adjusted is supplied into the processing chamber 201 together with the cleaning gas, and is exhausted through the exhaust tube 231. Concentration of the $F_2$ gas can be controlled by controlling the supply flow rate of the $N_2$ gas.

The $F_2$ gas introduced into the processing chamber 201 or the diluted $F_2$ gas is brought into contact with the deposit including the thin film such as SiOCN, SiCN, and SiN accumulated on the inner wall of the reaction tube 203 or the surface of the boat 217, when passing through the processing chamber 201, and at this time, the thin film is removed by thermal chemical reaction. Namely, the thin film is removed by an etching reaction between active species generated by thermal decomposition of the $F_2$ gas and the deposit. At this time, the $F_2$ gas and the diluted $F_2$ gas are brought into contact with the deposit including Si accumulated on the inner wall of the first nozzle 249$a$ when passing through the first nozzle 249$a$, and at this time, the deposit including Si is also removed.

When the previously set etching time of the thin film is elapsed to end the cleaning in the processing chamber 201, the valve 243$i$ is closed to stop the supply of the $F_2$ gas or the diluted $F_2$ gas into the processing chamber 201. Thereafter, the $N_2$ gas is supplied into the processing chamber 201 and is exhausted from the exhaust tube 231, to thereby purge the inside of the processing chamber 201.

Note that the etching condition for the thin film in the cleaning step is as follows.

Temperature in the processing chamber: 350° C. to 500° C.
Pressure in the processing chamber: 6650 Pa (50 Torr) to 26600 Pa (200 Torr), preferably 13300 Pa (100 Torr) or more and 19950 Pa (150 Torr) or less
Supply flow rate of $F_2$ gas: 0.5 to 5 slm
Supply flow rate of $N_2$ gas: 1 to 20 slm.

Wherein, etching is applied to the thin film while the value of the etching condition is maintained to a certain constant value within each range.

(4) Step of Forming the Silicon Oxide Film in a Processing Vessel

When the aforementioned cleaning step is completed, the step of forming the silicon oxide film (SiO film) is executed, which is the step of forming the silicon oxide film on the inside of the processing vessel, namely in the processing chamber 201 such as an inner wall of the reaction tube 203, with empty boat 217 having no wafer 200 mounted thereon, loaded into the processing chamber 201 (boat load).

The inside of the processing chamber 201 is vacuum-exhausted to be a desired pressure (degree of vacuum) by the vacuum pump 246. At this time, the pressure in the processing chamber 201 is measured by the pressure sensor 245, and based on the measured pressure information, the APC valve 244 is feedback-controlled (pressure adjustment). Further, the inside of the processing chamber 201 is heated to a desired temperature by the heater 207. At this time, based on the temperature information detected by the temperature sensor 263, the power supply condition to the heater 207 is feedback-controlled based on the temperature information detected by the temperature sensor 263 (temperature adjustment). Subsequently, the boat 217 is rotated by the rotation mechanism 267. Thereafter, four steps as will be described later are sequentially executed.

[Step 1]

The valve 243a of the first gas supply tube 232a is opened, to flow the HCD gas into the first gas supply tube 232a. The flow rate of the HCD gas flowed into the first gas supply tube 232a is adjusted by the mass flow controller 241a. The HCD gas with the flow rate adjusted is supplied into the processing chamber 201 from the gas supply holes 250a and is exhausted through the exhaust tube 231. At this time, the valve 243a is simultaneously opened, to flow the inert gas such as $N_2$ gas into the first inert gas supply tube 232e. The flow rate of the $N_2$ gas flowed into the first inert gas supply tube 232e is adjusted by the mass flow controller 241e. The $N_2$ gas with the flow rate adjusted is supplied into the processing chamber 201 together with the HCD gas and is exhausted through the exhaust tube 231.

At this time, the APC valve 244 is properly adjusted, to maintain the pressure in the processing chamber 201 to be less than the atmospheric pressure, in a range of 10 to 1000 Pa for example. The supply flow rate of the HCD gas controlled by the mass flow controller 241a is set in a range of 10 to 1000 sccm for example. The supply flow rate of the $N_2$ gas controlled by the mass flow controller 241e is set in a range of 200 to 2000 sccm for example. The time for exposing the inside of the processing chamber 201 to the HCD gas is set in a range of 1 to 120 seconds for example. The temperature of the heater 207 is set to allow the CVD reaction to occur in the processing chamber 201. Namely, the temperature of the heater 207 is set so that the temperature in the processing chamber 201 is 300 to 700° C., and preferably 350 to 650° C. for example. Note that when the temperature in the processing chamber is less than 300° C., HCD is hardly adsorbed on the inner wall, etc., of the processing chamber 201. Further, when the temperature in the processing chamber 201 exceeds 650° C. and particularly exceeds 700° C., the CVD reaction becomes strong, to thereby easily deteriorate uniformity. Therefore, the temperature in the processing chamber 201 is preferably set to 300 to 700° C.

By supplying the HCD gas into the processing chamber 201 under the aforementioned condition, the silicon layer (Si layer) being the silicon-containing layer of less than 1 atomic layer to several atomic layers, is formed on the inner wall of the reaction tube 203, the surface of the boat 217, surfaces of the first nozzle 249a, the second nozzle 249b, the third nozzle 249c, and the fourth nozzle 249d, and on an inner wall surface of the first nozzle 249a (simply called the inner wall, etc., of the processing chamber 201). The silicon-containing layer may be the chemical adsorption layer of HCD. The HCD is adsorbed on the surface of the inner wall, etc., of the processing chamber 201 under a condition that the HCD gas is not self-decomposed, to thereby form the chemical adsorption layer of HCD. Silicon molecules are deposited on the inner wall, etc., of the processing chamber 201 to thereby form the silicon layer under a condition that the HOD gas is self-decomposed. When the thickness of the silicon-containing layer formed on the inner wall, etc., of the processing chamber 201 exceeds several atomic layers, an oxidizing action in step 3 as will be described later, does not cover the whole body of the silicon-containing layer. A minimum value of the silicon-containing layer that can be formed on the inner wall, etc., of the processing chamber 201, is less than 1 atomic layer. Therefore, preferably the silicon-containing layer has the thickness of less than 1 atomic layer to several atomic layers.

Not only the inorganic raw materials such as STC, TCS, DCS, MCS, $SiH_4$, but also the organic raw materials such as aminosilane-based 4DMAS, 3DMAS, 2DEMAS, and BTBAS may be used as the raw material containing Si, other than the HCD. Rare gas such as Ar, He, Ne, and Xe may be used as the inert gas, other than the $N_2$ gas.

[Step 2]

After the silicon-containing layer is formed on the inner wall, etc., of the processing chamber 201, the valve 243a of the first gas supply tube 232a is closed, to stop the supply of the HCD gas. At this time, the inside of the processing chamber 201 is vacuum-exhausted by the vacuum pump 246, with the APC valve 244 of the exhaust tube 231 opened, to thereby remove the residual HCD gas from the processing chamber 201. At this time, when the inert gas is supplied into the processing chamber 201, the effect of removing the residual HCD gas is further increased. At this time, the temperature of the heater 207 is set to 300 to 700° C. and preferably 350 to 650° C. similarly to the temperature at the time of supplying the HCD gas.

[Step 3]

After the residual gas in the processing chamber 201 is removed, the valve 243d of the fourth gas supply tube 232d and the valve 243h of the fourth inert gas supply tube 232h are opened, to flow the $O_2$ gas into the fourth gas supply tube 232d and flow the $N_2$ gas into the fourth inert gas supply tube 232h. The flow rate of the $N_2$ gas flowed into the fourth inert gas supply tube 232h is adjusted by the mass flow controller 241h. The flow rate of the $O_2$ gas flowed into the fourth gas supply tube 232d is adjusted by the mass flow controller 241d. The $O_2$ gas with the flow rate adjusted is mixed with the $N_2$ gas with the flow rate adjusted, in the fourth gas supply tube 232d, and is supplied into the buffer chamber 237 from the gas supply holes 250d of the fourth nozzle 249d.

Simultaneously, the valve 243j of the sixth gas supply tube 232j is opened, to flow the $H_2$ gas into the sixth gas supply tube 232j. The flow rate of the $H_2$ gas flowed into the sixth gas supply tube 232j is adjusted by the mass flow controller 241j. The $H_2$ gas with the flow rate adjusted is mixed with the $O_2$ gas and the $N_2$ gas with the flow rate adjusted in the fourth gas supply tube 232d and is supplied into the buffer chamber 237 from the gas supply holes 250d of the fourth nozzle 249d.

At this time, the high frequency power is not applied between the first rod-type electrodes 269 and the second rod-type electrodes 270. Thus, the mixed gas of the $O_2$ gas and the $H_2$ gas supplied into the buffer chamber 237 is thermally activated and is supplied into the processing chamber 201 from the gas supply holes 250e. At this time, the mixed gas of the $O_2$ gas and the $H_2$ gas supplied into the buffer chamber 237 can also be activated by plasma by applying the high frequency power between the first rod-type electrodes 269 and the second rod-type electrodes 270.

At this time, the APC valve is properly adjusted, to maintain the pressure in the processing chamber 201 to less than the atmospheric pressure, in a range of 1 to 1000 Pa for example. The supply flow rate of the $O_2$ gas controlled by the mass flow controller 241d is set in a range of 100 to 10000 sccm for example. The supply flow rate of the $H_2$ gas controlled by the mass flow controller 241j is set in a range of 100 to 10000 sccm for example. The supply flow rate of the $N_2$ gas controlled by the mass flow controller 241h is set in a range of 200 to 2000 sccm for example. Note that the time for exposing the inner wall, etc., of the processing chamber 201 to the $O_2$ gas and the $H_2$ gas, is set in a range of 1 to 120 seconds for example. The temperature of the heater 207 is set in a range so that the temperature of the wafer 200 is within 350 to 1000° C. for example.

In this range of the temperature, it is confirmed that the effect of improving an oxidizing power can be obtained by adding the $H_2$ gas to the $O_2$ gas under a reduced pressure atmosphere. Further, it is also confirmed that the oxidizing power can't be obtained if the temperature in the processing chamber 201 is excessively low.

However, if throughput is taken into consideration, it is preferable to set the temperature of the heater 207 so as to be maintained in a temperature zone similar to a case that the HCD gas is supplied in step 1, which is the temperature capable of obtaining the effect of improving the oxidizing power, namely in the similar temperature zone in the processing chamber 201 in step 1 and step 3. In this case, the temperature of the heater 207 is set so that the temperature in the processing chamber 201 is set to be fixed in a range of 350 to 700° C., and preferably in a range of 350 to 650° C.

Further, insteps 1 to 4 as will be described later, it is further preferable to set the temperature in the processing chamber 201 so as to be maintained in the similar temperature zone. In this case, in steps 1 to 4 as will be described later, the temperature of the heater 207 is set so that the temperature in the processing chamber 201 is set to be constant in a range of 350 to 700° C., and preferably 350 to 650° C. for example. Note that in order to obtain the effect of improving the oxidizing power by adding the $H_2$ gas to the $O_2$ gas under the reduced pressure atmosphere, the temperature in the processing chamber 201 is required to be set to 350° C. or more. However, the temperature in the processing chamber 201 is preferably set to 400° C. or more, and is further preferably set to 450° C. or more. When the temperature in the processing chamber 201 is set to 400° C. or more, the oxidizing power exceeding the oxidizing power obtained by $O_3$ oxidizing processing performed at a temperature of 400° C. or more, can be obtained. When the temperature in the processing chamber 201 is set to 450° C. or more, the oxidizing power exceeding the oxidizing power obtained by $O_2$ plasma oxidizing processing performed at a temperature of 450° C. or more can be obtained.

By supplying the $O_2$ gas and the $H_2$ gas into the processing chamber 201 under the aforementioned condition, the $O_2$ gas and the $H_2$ gas are activated and reacted in the non-plasma state under the heated reduced pressure atmosphere, to thereby generate oxidizing species (reactive species) containing oxygen such as atomic oxygen (O). Then, the oxidizing processing is carried out in step 1 mainly by the oxidizing species, to the silicon-containing layer formed on the inner wall, etc., of the processing chamber 201. Then, by this oxidizing processing, the silicon-containing layer is changed (modified) to a silicon oxide layer ($SiO_2$ layer, also simply called SiO layer hereafter).

As the oxygen-containing gas, ozone ($O_3$) gas, etc., may be used other than the oxygen ($O_2$) gas. When an effect of adding hydrogen-containing gas to nitrous oxide (NO) gas and nitric monoxide ($N_2O$) gas is tried in the aforementioned temperature zone, it is confirmed that the effect of improving the oxidizing power can't be obtained, compared with a case of supplying the NO gas solely or supplying the $N_2O$ gas solely. Namely, it is preferable to use the oxygen-containing gas not containing nitrogen (gas not containing nitrogen but containing oxygen) as the oxygen-containing gas. Heavy hydrogen ($D_2$) gas, etc., may be used as the hydrogen-containing gas other than the hydrogen ($H_2$) gas. If ammonia ($NH_3$) gas or methane ($CH_4$) gas, etc., is used, nitrogen (N) impurities or carbon (C) impurities are considered to be mixed into the film. Namely, hydrogen-containing gas not containing other elements (gas not containing other elements but containing hydrogen or heavy hydrogen) is preferably used as the hydrogen-containing gas. Namely, at least one of the gases selected from a group consisting of the $O_2$ gas and the $O_3$ gas can be used as the oxygen-containing gas, and at least one of the gases selected from a group consisting of the $H_2$ gas and the $D_2$ gas can be used as the hydrogen-containing gas.

[Step 5]

After the silicon-containing layer is changed (modified) to the silicon oxide layer, the valve 243d of the fourth gas supply tube 232d is closed to stop the supply of the $O_2$ gas. Further, the valve 243j of the sixth gas supply tube 232j is closed to stop the supply of the $H_2$ gas. At this time, the inside of the processing chamber 201 is vacuum-exhausted by the vacuum pump 246, with the APC valve 244 of the exhaust tube 231 opened, to remove the residual $O_2$ gas and $H_2$ gas from the processing chamber 201. At this time, when the inert gas is supplied into the processing chamber 201, the effect of removing the residual $O_2$ gas and $H_2$ gas can be further increased (removal of the residual gas). At this time, the temperature of the heater 207 is set so that the temperature of the wafer 200 is set in a range of 350 to 700° C., preferably 350 to 650° C., similarly to the case of supplying the $O_2$ gas and $H_2$ gas.

The aforementioned steps 1 to 4 are set as 1 cycle, and by performing this cycle multiple number of times, the SiO film having the prescribed film thickness can be formed on the inner wall, etc., of the processing chamber 201.

When the film formation of the SiO film having the prescribed film thickness is completed, the inside of the processing chamber 201 is purged with the inert gas by supplying and exhausting the inert gas into/from the processing chamber 201 (purge). Thereafter, the atmosphere in the processing chamber 201 is replaced by the inert gas, and the pressure in the processing chamber 201 is returned to the normal pressure (returned to the atmospheric pressure).

Thereafter, the seal cap 219 is lowered by the boat elevator 115, to open the lower end of the reaction tube 203, and unload the empty boat 217 to the outside of the reaction tube 203 from the lower end of the reaction tube 203 (boat unload), and end the step of forming the SiO film in the processing vessel.

Figure 6:
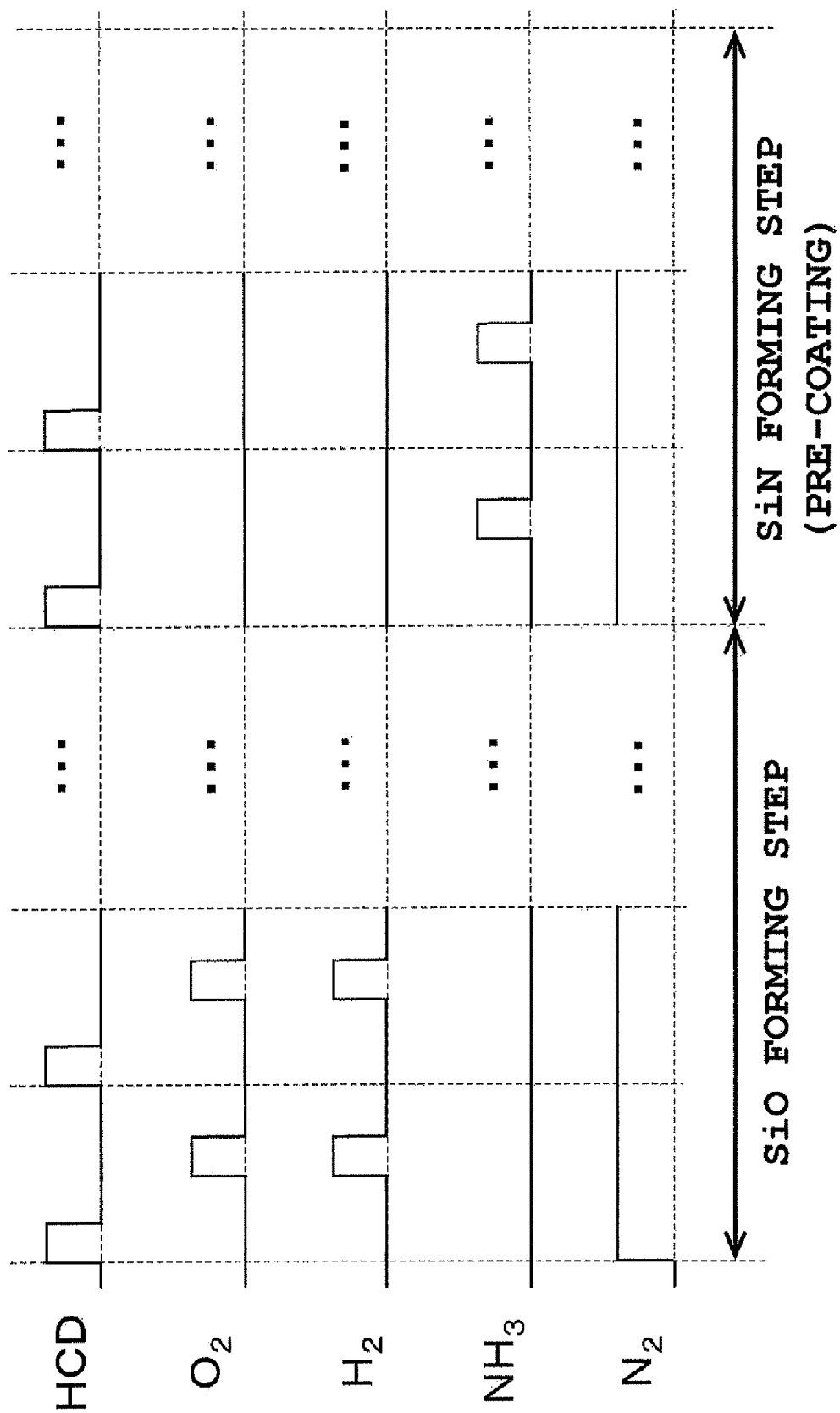
FIG. 6 is a view showing a timing of supplying gas for continuously forming the SiO film on the inner wall, etc., of a processing chamber, and pre-coating the SiN film, using a technique of this embodiment.

Thereafter, the aforementioned film forming step is restarted. The inner wall, etc., of the processing chamber 201 may be pre-coated with the same film as the thin film formed by the next film forming step such as the SiN film, before the film forming step is restarted. In this case, formation of the SiO film on the inner wall, etc., of the processing chamber 201, and pre-coating the inner wall, etc., with the SiN film, are preferably performed continuously in such a way that the SiO film having the prescribed film thickness is formed on the inner wall, etc., of the processing chamber 201, and thereafter each gas is flowed as shown in FIG. 6 without unloading the empty boat 217 from the reaction chamber 203. Namely, the supply of the HCD gas into the processing chamber 201, and the supply of the $O_2$ gas and the $H_2$ gas are set as 1 cycle, and by performing this cycle prescribed number of times, the SiO film having the prescribed film thickness is formed on the inner wall, etc., of the processing chamber 201, and thereafter the supply of the HCD gas into the processing chamber 201 and the supply of the $NH_3$ gas are performed continuously, which are set as 1 cycle, and by performing this cycle prescribed number of times, the SiN film having the prescribed film thickness is formed on the SiO film having the prescribed film thickness. In this case, a laminated film of the SiO film and the SiN film is formed on the inner wall, etc., of the processing chamber 201.

At this time, the SiO film may be formed on the SiO film instead of the SiN film, or the laminated film of the SiON film and the SiN film may be formed on the SiO film.

Figure 7:
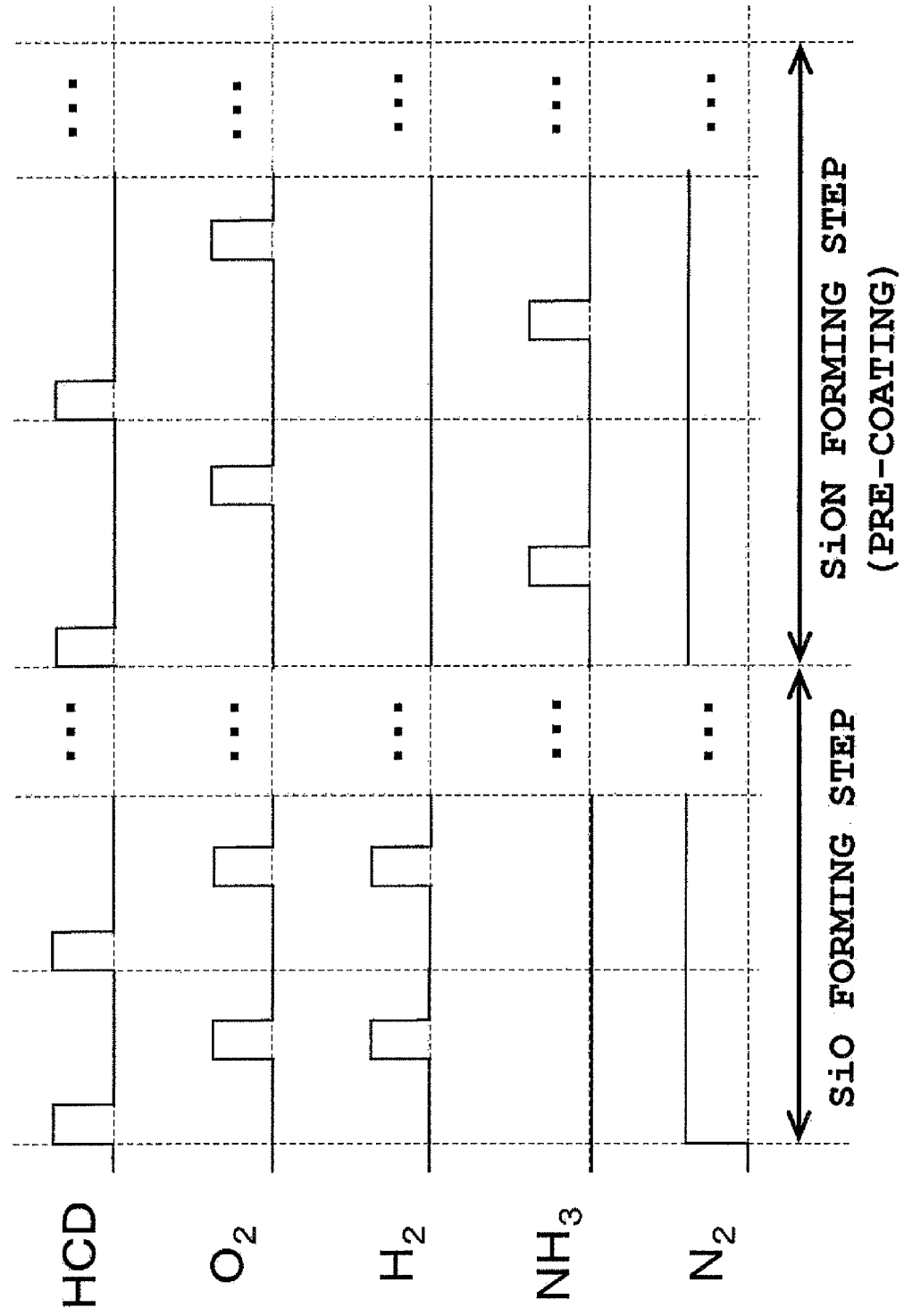
FIG. 7 is a view showing the timing of supplying gas for forming the SiO film on the inner wall, etc., of a processing chamber, and pre-coating it with the SiON film, continuously using a technique of this embodiment.

For example, when the SiON film is formed on the SiO film, it is preferable that each kind of gas is flowed as shown in FIG. 7, to thereby continuously perform the formation of the SiO film on the inner wall, etc., of the processing chamber 201, and the pre-coating the inner wall, etc., with the SiON film. Namely, the SiO film having the prescribed film thickness is formed on the inner wall, etc., of the processing chamber 201 and thereafter the supply of the HCD gas into the processing chamber 201 and the supply of the $O_2$ gas and the $H_2$ gas are set as 1 cycle, and by performing this cycle prescribed number of times, the SiO film having the prescribed film thickness is formed on the inner wall, etc., of the processing chamber 201, and thereafter continuously, the supply of the HCD gas into the processing chamber 201, the supply of the $NH_3$ gas, and the supply of the $O_2$ gas are set as 1 cycle, and by performing this cycle prescribed number of times, the SiON film having a prescribed thickness is formed on the SiO film having the prescribed film thickness. In this case, the laminated film of the SiO film and the SiON film is formed on the inner wall, etc., of the processing chamber 201.

Figure 8:
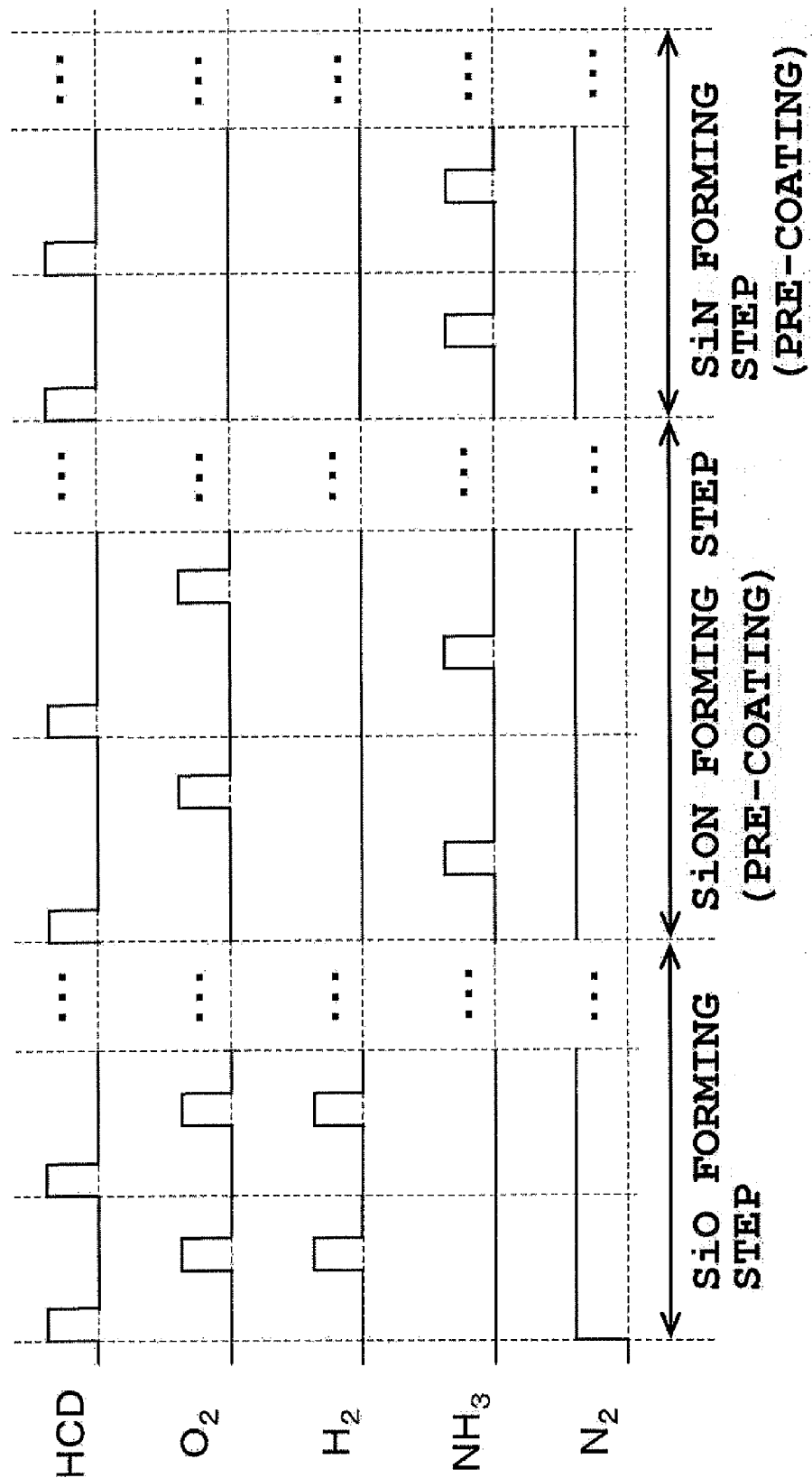
FIG. 8 is a view showing the timing of supplying gas for continuously forming the SiO film on the inner wall, etc., of a processing chamber, and pre-coating it with the SiON film, and also pre-coating it with the SiN film using a technique of this embodiment.

Further, for example, when the laminated film of the SiON film and the SiN film is formed on the SiO film, preferably each kind of gas is flowed as shown in FIG. 8, to thereby continuously perform the formation of the SiO film on the inner wall, etc., of the processing chamber 201, and the pre-coating the inner wall, etc., with the SiON film. Namely, the supply of the HCD gas into the processing chamber 201 and the supply of the $O_2$ gas and the $H_2$ gas are set as 1 cycle, and by performing this cycle prescribed number of times, the SiO film having the prescribed film thickness is formed on the inner wall, etc., of the processing chamber 201, and thereafter continuously, the supply of the HCD gas into the processing chamber 201, the supply of the $NH_3$ gas, and the supply of the $O_2$ gas are set as 1 cycle, and by performing this cycle prescribed number of times, the SiON film having the prescribed film thickness is formed on the SiO film having the prescribed film thickness, and thereafter further continuously, the supply of the HCD gas into the processing chamber 201 and the supply of the $NH_3$ gas are set as 1 cycle, and by performing this cycle prescribed number of times, the SiN film having the prescribed film thickness is formed on the SiON film having the prescribed film thickness. In this case, the laminated film of the SiO film, SiON film and the SiN film is formed on the inner wall, etc., of the processing chamber 201.

Further, at this time, the SiON film in which a composition ratio is changed from SiO to SiN little by little may be formed on the SiO film. In this case, for example, each kind of gas is flowed as shown in FIG. 7, to thereby continuously perform the formation of the SiO film on the inner wall, etc., of the processing chamber 201 and the pre-coating the inner wall, etc., with the SiON film as described above, or each kind of gas is flowed as shown in FIG. 8 to thereby continuously perform the formation of the SiO film on the inner wall, etc., of the processing chamber 201 and the pre-coating the inner wall, etc., with the SiON film as described above.

Then, when the SiON film is formed, the SiON film is formed with the composition ratio changed little by little from SiO to SiN in a thickness direction, so that the composition of the SiON film shows oxygen-rich on the side where the SiON film is in a contact state with the SiO film, and shows nitrogen-rich on the side where the SiON film is in a contact state with the SiN film. For example, at an initial time of forming the SiON film, the pressure in the processing chamber at the time of supplying the $O_2$ gas is made relatively larger, and the pressure is made gradually smaller as the film formation progresses, and by making the pressure relatively smaller at the end of the film formation, the oxidizing power by the $O_2$ gas can be made gradually smaller as the film formation progresses, and the SiON film with the composition ratio changed little by little in the thickness direction, can be formed.

(5) Effect of this Embodiment

According to this embodiment, one or a plurality of effects described below can be exhibited.

(a) According to this embodiment, when the cleaning step is completed, the step of forming the SiO film is executed, which is the step of forming the SiO film by the aforementioned technique, on the inner wall, etc., in the reaction tube 203, namely in the processing chamber 201 in a state that the empty boat 217 with the wafer 200 not mounted thereon, is loaded into the processing chamber 201. It is found by inventors of the present invention, that a removal rate by the cleaning gas containing fluorine (F) element for removing the SiO film formed by the aforementioned technique, is significantly smaller than the removal rate for removing quartz. Owing to such knowledge, damage of a quartz member at the time of executing the next cleaning step, can be reduced by pre-coating the surface of the quartz member which is exposed to the processing chamber 201, with the SiO film using the aforementioned technique. Thus, generation of foreign matters can be reduced, which is generated from the quartz member, and a production yield of the semiconductor device can be improved. Further, the temperature in the processing chamber 201 at the time of executing the cleaning step can be increased, and the removal rate for removing the deposit such as a SiN film can be increased. Namely, both the reduction of the damage received by the quartz member, and the increase of the removal rate for removing the deposit such as a SiN film can be achieved.

FIG. 4(a) shows a measurement result of the removal rate by the cleaning gas for removing the SiO film, SiN film, SiCN film (simply called SiO film, SiN film, SiCN film hereafter respectively). In FIG. 4(a), the removal rate at each cleaning temperature is measured for removing quartz, SiO film, SiN film, and SiCN film, wherein the cleaning temperature is set to 500° C., 600° C., and the $NF_3$ gas is used as the cleaning gas.

FIG. 4(b) shows a selection ratio based on the measurement result of FIG. 4(a). In FIG. 4(b), the selection ratio of the SiN film or the SiCN film with respect to the quartz or the SiO film at each cleaning temperature is obtained. Note that the selection ratio shows the ratio of the removal rate for removing the SiN film or the SiCN film with respect to the removal rate for removing the quartz or the SiO film. FIG. 4(b) shows that as the selection ratio is larger, the damage of the base becomes smaller when over-cleaning (over-etching) is performed to the SiN film or the SiCN film.

Note that in FIG. 4, the SiO film, the SiN film, and the SiCN film formed by the aforementioned technique, are simply called "SiO", "SiN", and "SiCN" respectively. Further, the ratio (selection ratio) of the removal rate for removing the SiN film with respect to the removal rate for removing quartz, the ratio (selection ratio) of the removal rate for removing the SiN film with respect to the removal rate for removing the SiO film, the ratio (selection ratio) of the removal rate for removing the SiCN film with respect to the removal rate for removing quartz, and the ratio (selection ratio) of the removal rate for removing the SiCN film with respect to the removal rate for removing the SiO film, are respectively simply called "SiN/quartz", "SiN/SiO", "SiCN/quartz", "SiCN/SiO".

As a result of the measurement, as shown in FIG. 4(a), when the temperature in the processing chamber 201 is 500° C., the removal rate for removing the quartz, SiO film, SiN film, and SiCN film is respectively 49.0 Å/min, 6.1 Å/min, 30.0 Å/min, and 24.2 Å/min. Further, when the temperature in the processing chamber 201 is 600° C., the removal rate for removing the quartz, SiO film, SiN film, and SiCN film is 2130 Å/min, 29.9 Å/min, 1540 Å/min, and 861.9 Å/min respectively.

Further, as shown in FIG. 4(b), when the temperature in the processing chamber 201 is 500° C., the ratio (selection ratio) of the removal rate for removing the SiN film with respect to the removal rate for removing quartz, is 0.6, and the ratio (selection ratio) of the removal rate for removing the SiN film with respect to the removal rate for removing the SiO film is 4.9, and the ratio (selection ratio) of the removal rate for removing the SiCN film with respect to the removal rate for removing quartz is 0.5, and the ratio (selection ratio) of the removal rate for removing the SiCN film with respect to the removal rate for removing the SiO film is 3.9. Further, when the temperature in the processing chamber 201 is 600° C., the ratio (selection ratio) of the removal rate for removing the SiN film with respect to the removal rate for removing quartz is 0.7, and the ratio (selection ratio) of the removal rate for removing the SiN film with respect to the removal rate for removing the SiO film is 51.6, and the ratio (removal ratio) of the removal rate for removing the SiCN film with respect to the removal rate for removing quartz is 0.4, and the ratio (selection ratio) of the removal rate for removing the SiCN film with respect to the removal rate for removing the SiO film is 28.9.

Namely, it is found that the ratio (selection ratio) of the removal rate for removing the SiN film with respect to the removal rate for removing the SiO film is larger than the ratio (selection ratio) of the removal rate for removing the SiN film with respect to the removal rate for removing quartz, at any temperature. It is also found that the ratio (selection ratio) of the removal rate for removing the SiCN film with respect to the removal rate for removing the SiO film is larger than the ratio (selection ratio) of the removal rate for removing the SiCN film with respect to the removal rate for removing quartz, at any temperature. Note that when the temperature in the processing chamber 201 is increased, it is found that although the ratio (selection ratio) of the removal rate for removing the SiN film and the SiCN film with respect to the removal rate for removing quartz is not changed so much, the ratio (selection ratio) of the removal rate for removing the SiN film and the SiCN film with respect to the removal rate for removing the SiO film becomes large. For example, when the temperature in the processing chamber 201 is 600° C., the ratio (selection ratio) of the removal rate for removing the SiN film with respect to the removal rate for removing quartz, is about 1.2 times the ratio (selection ratio) of the removal rate for removing the SiN film with respect to the removal rate for removing quartz when the temperature in the processing chamber 201 is 500° C. Meanwhile, when the temperature in the processing chamber 201 is 600° C., the ratio (selection ratio) of the removal rate for removing the SiN film with respect to the removal rate for removing the SiO film is more than 10 times the ratio (selection ratio) of the removal rate for removing the SiN film with respect to the removal rate for removing the SiO film when the temperature in the processing chamber 201 is 500° C.

As described above, it is found that the damage of the base at the time of over-cleaning the SiN film and the SiCN film, etc., can be made small by coating the surface of the quartz member exposed to the processing chamber 201, with the SiO film by the aforementioned technique, and changing (modifying) the base such as the SiN film and the SiCN film being cleaning targets, to the SiO film formed by the aforementioned technique. Note that as the cleaning temperature is increased, the ratio (selection ratio) of the removal rate for removing the SiN film and the SiCN film with respect to the removal rate for removing the SiO film becomes large, and therefore it is found that a coating effect of the SiO film by the aforementioned technique is remarkably exhibited in a high temperature area.

FIG. 5(a) shows the measurement result of the removal rate by the cleaning gas for removing the SiO film, SiN film, and SiCN film (simply called SiO film, SiN film, SiCN film respectively). In FIG. 5(a), the cleaning temperature is set to 400° C., and $ClF_3$ gas is used as the cleaning gas, and the removal rate of the quartz, SiO film, SiN film, and SiCN film is measured respectively.

FIG. 5(b) shows the selection ratio based on the measurement result of FIG. 5(a). In FIG. 5(b), the selection ratio of the SiN film or the SiCN film with respect to the quartz or the SiO film is obtained based on the measurement result of FIG. 5(a).

In FIG. 5, similarly to FIG. 4, the SiO film, SiN film, and SiCN film formed by the aforementioned technique, are simply called "SiO", "SiN", and "SiCN" respectively. Further, the ratio (selection ratio) of the removal rate for removing the SiN film with respect to the removal rate for removing quartz, the ratio (selection ratio) of the removal rate for removing the SiN film with respect to the removal rate for removing the SiO film, the ratio (selection ratio) of the removal rate for removing the SiCN film with respect to the removal rate for removing quartz, and the ratio (selection ratio) of the removal rate for removing the SiCN film with respect to the removal rate for removing the SiO film, are simply called "SiN/quartz", "SiN/SiO", "SiCN/quartz", and "SiCN/SiO" respectively.

As a result of the measurement, as shown in FIG. 5(a), when the temperature in the processing chamber 201 is 400° C., the removal rate for removing the quartz, SiO film, SiN film, and SiCN film are 14.5 Å/min, 11.9 Å/min, 147.6 Å/min, and 306.6 Å/min respectively.

Further, as shown in FIG. 5(b), when the temperature in the processing chamber 201 is 400° C., the ratio (selection ratio) of the removal rate for removing the SiN film with respect to the removal rate for removing quartz is 10.2, and the ratio (selection ratio) of the removal rate for removing the SiN film with respect to the removal rate for removing the SiO film is 12.4, and the ratio (selection ratio) of the removal rate for removing the SiCN film with respect to the removal rate for removing quartz is 21.2, and the ratio (selection ratio) of the removal rate for removing the SiCN film with respect to the removal rate for removing the SiO film is 25.8.

Namely, it is found that the ratio (selection ratio) of the removal rate for removing the SiN film with respect to the removal rate for removing the SiO film, is larger than the ratio (selection ratio) of the removal rate for removing the SiN film with respect to the removal rate for removing quartz. It is also found that the ratio (selection ratio) of the removal rate for removing the SiCN film with respect to the removal rate for removing the SiO film is larger than the ratio (selection ratio) of the removal rate for removing the SiCN film with respect to the removal rate for removing quartz.

As described above, it is found that the damage of the base at the time of over-cleaning the SiN film and the SiCN film, etc., can be made small by coating the surface of the quartz member which is exposed to the processing chamber 201, and changing (modifying) the base such as SiN film and SiCN film being cleaning objects, to the SiO film formed by the aforementioned technique.

In addition, the surface of the quartz member exposed to the processing chamber 201 is coated with the SiO film by the aforementioned technique, and thereafter continuously the oxygen-containing gas and the hydrogen-containing gas are supplied into the heated processing chamber 201 which is set in the pressure less than the atmospheric pressure, to modify the SiO film by annealing, to thereby further reduce the impurities in the SiO film and further densify the SiO film. The SiO film thus formed by the aforementioned technique has an excellent characteristic that the SiO film is originally dense, and for example, it is a denser film than quartz or CVD-SiO film. However, a further dense film can be obtained by further modifying the SiO film by annealing as described above. Thus, the removal rate for removing the SiO film can be made further small, and the damage of the base at the time of over-cleaning the SiN film and the SiCN film, etc., can be made further small. In addition, such an effect can be obtained even when the temperature in the processing chamber 201 at the time of annealing the SiO film is set to be equivalent to the temperature in the processing chamber 201 at the time of forming the SiO film, and such an effect can be increased by setting the temperature in the processing chamber 201 at the time of annealing the SiO film higher than the temperature in the processing chamber 201 at the time of forming the SiO film.

(b) According to this embodiment, when the cleaning step is completed, step 1 of flowing the HCD gas through the processing chamber 201, step 2 of purging the inside of the processing chamber 201, and step 3 of flowing the $O_2$ gas and the $H_2$ gas into the processing chamber 201 under the reduced pressure, and step 4 of purging the inside of the processing chamber 201, are set as 1 cycle, and by performing this cycle multiple number of times, the SiO film is formed on the inner wall, etc., of the processing chamber 201. The SiO film formed by this technique has an excellent step coverage, and therefore the damage received by the quartz of the base can be effectively repaired. For example, as shown in FIG. 9, cracks can be effectively repaired by embedding the cracks, etc., generated in the quartz of the base, with the SiO film formed by this technique. Note that FIG. 9(a) shows a state of the inner wall, etc., of the processing chamber 201 before cleaning, and FIG. 9(b) shows a state that the damage is received by the inner wall, etc., of the processing chamber 201 by the over-cleaning, and FIG. 9(c) shows a state that the damage added on the inner wall, etc., of the processing chamber 201 is repaired by forming the SiO film by the technique of this embodiment, respectively. Thus, the generation of the foreign matters from the quartz member can be reduced, and the production yield of the semiconductor device can be improved.

(c) According to this embodiment, residuals such as cleaning gas (residual fluorine) can be easily discharged from the processing chamber 201 by executing the step of forming the SiO film in the processing chamber by the aforementioned technique. Namely, according to this embodiment, the $O_2$ gas and the $H_2$ gas are supplied into the heated processing chamber 201 under the reduced pressure in a process of forming the SiO film by the aforementioned technique in the processing vessel after the cleaning step. As a result, the residual fluorine in the processing chamber 201 is consumed by the reaction between the $H_2$ gas and the residual fluorine (F) supplied into the processing chamber 201 to generate HF. Further, the residual fluorine in the processing chamber 201 is removed by replacing atomic oxygen (O) or $O_2$ gas generated by the reaction between the $O_2$ gas and the $H_2$ gas supplied into the processing chamber 201. Thus, according to this embodiment, the residuals such as cleaning gas can be easily discharged by supplying the $O_2$ gas and the $H_2$ gas into the heated processing vessel under the reduced pressure in the process of forming the SiO film by the aforementioned technique in the processing vessel after the cleaning step. Then, reproducibility of the film formation processing in the next film forming step can be improved, and the generation of metal contamination on the wafer 200 can be prevented.

In a conventional substrate processing apparatus, the residuals such as cleaning gas exist in the processing chamber after the cleaning step, thus not facilitating discharge, and the reproducibility of the film formation processing in the next film forming step is reduced, and the metal contamination is generated in some cases. Therefore, when the cleaning step is completed, the inside of the processing chamber is processed (pre-coated) with the same film as the thin film formed by the next film forming step, such as the SiN film, in some cases. Meanwhile, according to this embodiment, the residuals such as cleaning gas can be easily discharged from the processing chamber 201, and therefore there is no need for the aforementioned pre-coating necessarily, thus making it possible to improve the reproducibility of the film formation processing. Further, the generation of the metal contamination can be prevented.

(d) In this embodiment, downtime of the substrate processing apparatus can be shortened by setting the film thickness of the SiO film to 200 Å or more and 1000 Å or less, which is the SiO film formed on the inside of the processing vessel after the cleaning step, and the effect of the quartz member as a protective film in the processing chamber 201 can be increased and the removal effect of the residual fluorine in the processing chamber 201 can be increased respectively. Note that when the SiO film formed on the inside of the processing vessel after the cleaning step has a film thickness of less than 200 Å for example, there is a possibility that the surface of the quartz member such as the reaction tube 203 and the boat 217 is partially exposed by etching the SiO film at the time of executing the next cleaning step, thus reducing the effect of the quartz member as the protective film in some cases. In addition, the effect of removing the residual fluorine from the processing chamber 201 in the process of forming the SiO film, is also reduced in some cases. Further, if the SiO film formed on the inside of the processing vessel after the cleaning step has a larger film thickness than 1000 Å for example, too much time is required for forming the SiO film, thus prolonging the downtime of the substrate processing apparatus. In this embodiment, the above-described problems can be solved by setting the film thickness of the SiO film to 200 Å or more and 1000 Å or less, which is the SiO film formed on the inside of the processing vessel after the cleaning step.

(e) In this embodiment, after executing the step of forming the SiO film in the processing chamber 201, processing (pre-coating) of covering the inside of the processing chamber 201 with the same film as the thin film formed in the next film forming step, such as the SiN film, may be executed. By executing such processing, the reproducibility of the film formation processing in the next film forming step can be further improved, and the generation of the metal contamination on the wafer 200 can be surely prevented.

(f) When the SiN film is formed in the film forming step as described above, by forming the SiON film, and the laminated film of the SiON film and the SiN film, and the SiON film in which the composition ratio is changed little by little from SiO to SiN, on the SiO film formed in the processing chamber 201, stress added on the SiN film deposited on these films can be reduced by repeating the film forming step. Namely, the SiON film formed between the SiO film and the SiN film, the laminated film of the SiON film and the SiN film, and the SiON film in which the composition ratio is changed little by little, function as a buffer layer absorbing the stress (stress absorption layer or stress relaxation layer), to thereby relax the stress added on the SiN film. Thus, cracks or peel-off of the SiN film can be prevented, and generation of particles in the processing chamber 201 can be suppressed.

Other Embodiment of the Present Invention

Embodiments of the present invention are described above. However, the present invention is not limited to the aforementioned embodiments, and can be variously modified in a range not departing from the gist of the present invention.

For example, in the step of forming the SiO film in the processing vessel, the SiO film may be formed on the inner wall surface of the first nozzle 249a by the aforementioned technique. In this case, a gas supply system may be formed so that the oxygen-containing gas and the hydrogen-containing gas can be supplied into the first nozzle 249a as well. In the cleaning step, the cleaning gas is flowed by the first nozzle 249a, and at this time, the deposit adhered to the inside of the first nozzle 249a is also removed, and therefore the formation of the SiO film on the inner wall, etc., of the first nozzle 249a becomes also effective by the aforementioned technique.

Further, for example, the step of forming the SiO film in the processing vessel is not limited to a case of executing this step after the cleaning step, and may be executed in advance before executing the film forming step. Thus, the damage added on the quartz member can be reduced during executing the cleaning step, and the generation of foreign matters from the quartz member can be reduced, and the production yield of the semiconductor device can be improved. Further, the reproducibility of the film formation processing in the next film forming step can be further improved, and the generation of the metal contamination on the wafer 200 can be surely prevented.

Note that the step of forming the SiO film in the processing vessel is more effective to be performed before the first film formation in the processing chamber, than to be performed after completing the cleaning step as described in the aforementioned embodiments. By thus executing the step, the damage of the quartz member such as the reaction tube 203 and the boat 217 can be surely prevented. FIG. 10(a) shows a state of the inner wall, etc., of the processing chamber 201 before cleaning, when executing the step as described above. The SiN film being the cleaning target is formed not on the surface of the quartz member but on the SiO film being the base, by forming the SiO film in the processing vessel before executing the film formation for the first time. When the film thickness of the SiN film reaches a prescribed thickness, cleaning is performed similarly to the aforementioned embodiment. FIG. 10(b) shows a state that the inner wall, etc., of the processing chamber 201 is protected from the over-cleaning by the SiO film of the base. The SiO film formed by the technique of the aforementioned embodiment is a dense film having a characteristic that it is hardly etched. Therefore, only a part of the SiO film of the base is etched to be thin, and the inner wall, etc., of the processing chamber 201 is not exposed. Thus, the damage added on the quartz member such as the reaction tube 203 can be surely prevented. Note that the SiO film which is thin partially by over-etching, can be repaired by re-creating the SiO film (re-coating) by the technique of the aforementioned embodiment. FIG. 10(c) shows a state that the SiO film of the base is repaired by the technique of this embodiment. When the cleaning is executed, the SiO film of the base is etched to be thin, and therefore re-creation of the SiO film is preferably performed every time the cleaning is executed. Namely, the cleaning and the re-creation of the SiO film are preferably performed as a set. Note that the re-creation of the SIC film may be executed every time the cleaning is performed multiple number of times.

Further, for example, not only the SiOCN film, the SiCN film, and the SiN film shown in the aforementioned embodiment, but also the Si film, the SiON film, and the SiOC film may be used as the film formed in the film forming step.

Further, for example, not only the $F_2$ gas shown in the aforementioned embodiment but also other gas containing fluorine (F) element such as $NF_3$ gas, $ClF_3$ gas, and HF gas may be used as the cleaning gas.

Further, for example, activation of the $C_3H_6$ gas, the $NH_3$ gas, and the $O_2$ gas supplied into the processing chamber 201 in the film forming step, is not limited to a case of thermally activating them, and these gases may be activated using plasma for example.

Preferred Aspects of the Present Invention

Preferred aspects of the present invention will be supplementarily described hereafter.

According to an aspect of the present invention, there is provided a method of manufacturing a semiconductor device, including:

forming a thin film different from a silicon oxide film on a substrate by supplying a processing gas into a processing vessel in which a substrate is housed;

removing a deposit including the thin film adhered to an inside of the processing vessel by supplying a fluorine-containing gas into the processing vessel after executing forming the thin film prescribed number of times; and forming a silicon oxide film having a prescribed film thickness on the inside of the processing vessel by alternately supplying a silicon-containing gas, and an oxygen-containing gas and a hydrogen-containing gas into the heated processing vessel in which a pressure is set to be less than the atmospheric pressure after removing the deposit.

Preferably, in forming the silicon oxide film having the prescribed film thickness on the inside of the processing vessel, the silicon oxide film is formed on the inside of the processing vessel and meanwhile fluorine remained in the processing vessel is reacted with reactive species generated by a reaction between the oxygen-containing gas and the hydrogen-containing gas in the heated processing vessel in which the pressure is set to be less than the atmospheric pressure, and the fluorine is then discharged.

Further preferably, in forming the silicon oxide film having the prescribed film thickness on the inside of the processing vessel, fluorine remained in the processing vessel is reacted with the oxygen-containing gas and the reactive species while forming the silicon oxide film on the inside of the processing vessel, and the fluorine is then discharged.

Further preferably, in forming the silicon oxide film having the prescribed film thickness on the inside of the processing vessel, the fluorine remained in the processing vessel is reacted with the oxygen-containing gas, the hydrogen-containing gas, and the reactive species while forming the silicon oxide film on the inside of the processing vessel, and the fluorine is then discharged.

Further preferably, in forming the silicon oxide film having the prescribed film thickness on the inside of the processing vessel, the silicon oxide film having the film thickness of 200 Å or more and 1000 Å or less is formed.

Further preferably, after forming the silicon oxide film having the prescribed film thickness on the inside of the processing vessel, the method comprises:

forming the thin film on the silicon oxide film on the inside of the processing vessel by supplying the processing gas into the processing vessel; and forming the thin film on the substrate by supplying the processing gas into the processing vessel after the thin film is formed in which a substrate is housed.

Further preferably, after forming the silicon oxide film having the prescribed film thickness on the inside of the processing vessel, the method comprises:

forming a buffer layer containing elements constituting the thin film and oxygen, on the silicon oxide film on the inside of the processing vessel by supplying the processing gas and the oxygen-containing gas into the processing vessel;

forming the thin film on the buffer layer by supplying the processing gas into the processing vessel; and forming the thin film on the substrate by supplying the processing gas into the processing vessel in which the substrate is housed after forming the thin film.

Further preferably, the processing vessel is made of quartz, and in forming the silicon oxide film having the prescribed film thickness on the inside of the processing vessel, cracks generated in the quartz at the time of removing the deposit are repaired.

Further preferably, the thin film is a silicon film, a silicon nitride film, a silicon oxynitride film, a silicon carbonitride film, a silicon oxycarbonitride film, and a silicon oxycarbide film.

Further preferably, the thin film is a silicon nitride film or a silicon carbonitride film.

Further preferably, the fluorine-containing gas is fluoride gas, nitrogen fluoride gas, chlorine fluoride gas, or hydrogen fluoride gas.

Further preferably, the fluorine-containing gas is nitrogen fluoride gas or chlorine fluoride gas.

According to other aspect of the present invention, there is provided a method of manufacturing a semiconductor device, including:

forming a silicon oxide film having a prescribed film thickness on an inside of a processing vessel by alternately supplying a silicon-containing gas, and an oxygen-containing gas and a hydrogen-containing gas into the heated processing vessel in which a pressure is set to be less than an atmospheric pressure;

forming a thin film different from the silicon oxide film on a substrate by supplying a processing gas into the processing vessel in which the substrate is housed after forming the silicon oxide film;

removing a deposit including the thin film adhered to an inside of the processing vessel by supplying a fluorine-containing gas into the processing vessel after executing forming the thin film prescribed number of times; and forming a silicon oxide film having the prescribed film thickness on the inside of the processing vessel by alternately supplying the silicon-containing gas, and the oxygen-containing gas and the hydrogen-containing gas into the heated processing vessel in which the pressure is set to be less than the atmospheric pressure after removing the deposit.

Preferably, in forming the silicon oxide film having the prescribed film thickness on the inside of the processing vessel after removing the deposit, the silicon oxide film, from which a part thereof is removed together with the deposit when the deposit is removed, is repaired.

According to other aspect of the present invention, there is provided a substrate processing apparatus, including:

a processing vessel in which a substrate is housed;

a heater configured to heat an inside of the processing vessel;

a pressure adjuster configured to adjust a pressure in the processing vessel;

a processing gas supply system configured to supply a processing gas into the processing vessel;

a fluorine-containing gas supply system configured to supply a fluorine-containing gas into the processing vessel;

a silicon-containing gas supply system configured to supply a silicon-containing gas into the processing vessel;

an oxygen-containing gas supply system configured to supply an oxygen-containing gas into the processing vessel;

a hydrogen-containing gas supply system configured to supply a hydrogen-containing gas into the processing vessel; and a controller configured to control the heater, the pressure adjuster, the processing gas supply system, the fluorine-containing gas supply system, the silicon-containing gas supply system, the oxygen-containing gas supply system, and the hydrogen-containing gas supply system, so as to execute forming a thin film different from a silicon oxide film on the substrate by supplying the processing gas into the processing vessel in which the substrate is housed; removing a deposit including the thin film adhered to the inside of the processing vessel by supplying the fluorine-containing gas into the processing vessel after executing forming the thin film prescribed number of times; and forming a silicon oxide film having a prescribed film thickness on the inside of the processing vessel by alternately supplying the silicon-containing gas, and the oxygen-containing gas and the hydrogen-containing gas into the heated processing vessel in which the pressure is set to be less than an atmospheric pressure after removing the deposit.

According to further other aspect of the present invention, there is provided a substrate processing apparatus, including:

a processing vessel in which a substrate is housed;
a heater configured to heat inside of the processing vessel;
a pressure adjuster configured to adjust a pressure in the processing vessel;
a processing gas supply system configured to supply a processing gas into the processing vessel;
a fluorine-containing gas supply system configured to supply a fluorine-containing gas into the processing vessel;
a silicon-containing gas supply system configured to supply a silicon-containing gas into the processing vessel;
an oxygen-containing gas supply system configured to supply an oxygen-containing gas into the processing vessel;
a hydrogen-containing gas supply system configured to supply a hydrogen-containing gas into the processing vessel: and
a controller configured to control the heater, the pressure adjuster, the processing gas supply system, the fluorine-containing gas supply system, the silicon-containing gas supply system, the oxygen-containing gas supply system, and the hydrogen-containing gas supply system, so as to execute forming a silicon oxide film having a prescribed film thickness on the inside of the processing vessel by alternately supplying the silicon-containing gas, and the oxygen-containing gas and the hydrogen-containing gas into the heated processing vessel in which a pressure is set to be less than an atmospheric pressure; forming a thin film different from the silicon oxide film on the substrate by supplying the processing gas into the processing vessel in which the substrate is housed after forming the silicon oxide film; removing a deposit including the thin film adhered to the inside of the processing vessel by supplying the fluorine-containing gas into the processing vessel after executing forming the thin film prescribed number of times; and forming a silicon oxide film having the prescribed film thickness on the inside of the processing vessel by alternately supplying the silicon-containing gas, and the oxygen-containing gas and the hydrogen-containing gas into the heated processing vessel in which the pressure is set to be less than the atmospheric pressure after removing the deposit.

DESCRIPTION OF SIGNS AND NUMERALS

121 Controller
200 Wafer
201 Processing chamber
202 Processing furnace
203 Reaction tube
207 Heater
231 Exhaust tube
232a First gas supply tube
232b Second gas supply tube
232c Third gas supply tube
232d Fourth gas supply tube
232i Fifth gas supply tube
232j Sixth gas supply tube

The invention claimed is:

1. A method for manufacturing a semiconductor device, the method comprising:

forming a thin film different from a silicon oxide film on a substrate by supplying a processing gas into a processing vessel in which the substrate is housed;
removing a deposit including the thin film adhered to an inside of the processing vessel by supplying a fluorine-containing gas into the processing vessel in which a substrate is not housed, after executing the formation of the thin film a prescribed number of times; and
forming a silicon oxide film having a prescribed film thickness on the inside of the processing vessel by alternately supplying a silicon-containing gas, and an oxygen-containing gas and a hydrogen-containing gas into the processing vessel in which a substrate is not housed, after the removal of the deposit, wherein:

the formation of the silicon oxide film having the prescribed film thickness on the inside of the processing vessel includes alternating:

(1) forming a silicon-containing layer on the inside of the processing vessel by supplying the silicon-containing gas into the processing vessel that is heated and in which a pressure is set to be less than an atmospheric pressure, and (2) changing the silicon-containing layer to a silicon oxide layer by oxidizing the silicon-containing layer by a reactive species containing atomic oxygen, the reactive species containing the atomic oxygen being generated by supplying the oxygen-containing gas and the hydrogen-containing gas into the processing vessel that is heated and in which a pressure is set to be less than the atmospheric pressure, thermally activating the oxygen-containing gas and the hydrogen-containing gas in a non-plasma state and causing a reaction between the oxygen-containing gas and the hydrogen-containing gas in the processing vessel, and in the formation of the silicon oxide film having the prescribed film thickness on the inside of the processing vessel, fluorine remaining in the processing vessel is reacted with the reactive species containing the atomic oxygen, and is discharged, while forming the silicon oxide film on the inside of the processing vessel.

2. The method of claim 1, wherein in the formation of the silicon oxide film having the prescribed film thickness on the inside of the processing vessel, the fluorine remaining in the processing vessel is reacted with the oxygen-containing gas and the reactive species containing the atomic oxygen, and is discharged, while forming the silicon oxide film on the inside of the processing vessel.

3. The method of claim 2, wherein in the formation of the silicon oxide film having the prescribed film thickness on the inside of the processing vessel, the fluorine remaining in the processing vessel is reacted with the oxygen-containing gas, the hydrogen-containing gas, and the reactive species containing the atomic oxygen, and is discharged, while forming the silicon oxide film on the inside of the processing vessel.

4. The method of claim 1, wherein in the formation of the silicon oxide film having the prescribed film thickness on the inside of the processing vessel, the prescribed film thickness is 200 Å or more and 1000 Å or less.

5. The method of claim 1, further comprising:

forming the thin film on the silicon oxide film on the inside of the processing vessel by supplying the processing gas into the processing vessel in which a substrate is not housed, after the formation of the silicon oxide film having the prescribed film thickness on the inside of the processing vessel; and forming the thin film on a substrate by supplying the processing gas into the processing vessel in which the substrate is housed after the formation of the thin film on the silicon oxide film.

6. The method of claim 1, further comprising:

forming a buffer layer including elements constituting the thin film and oxygen on the silicon oxide film on the inside of the processing vessel by supplying the processing gas and an oxygen-containing gas into the processing vessel in which a substrate is not housed, after the formation of the silicon oxide film having the prescribed film thickness on the inside of the processing vessel;

forming the thin film on the buffer layer by supplying the processing gas into the processing vessel in which a substrate is not housed; and forming the thin film on a substrate by supplying the processing gas into the processing vessel in which the substrate is housed after the formation of the thin film on the buffer layer.

7. The method of claim 6, wherein the buffer layer is a stress relaxation layer for relaxing a stress added on the thin film.

8. The method of claim 6, wherein
the thin film is a silicon nitride film, and
the buffer layer is a silicon oxynitride film.

9. The method of claim 8, wherein the buffer layer is a silicon oxynitride film formed by changing a composition ratio little by little from a silicon oxide film to a silicon nitride film.

10. The method of claim 8, wherein the buffer layer is a silicon oxynitride film with a composition ratio changed little by little from a silicon oxide film to a silicon nitride film in a thickness direction, so that a composition of the buffer layer shows oxygen-rich on the side where the buffer layer is in a contact state with the silicon oxide film, and shows nitrogen-rich on the side where the buffer layer is in a contact state with the silicon nitride film.

11. The method of claim 1, wherein the processing vessel is made of quartz, and in the formation of the silicon oxide film having the prescribed film thickness on the inside of the processing vessel, cracks generated in the quartz at the time of the removal of the deposit are repaired.

12. The method of claim 1, wherein the oxygen-containing gas is a gas that does not include nitrogen, and the hydrogen-containing gas is a gas that does not include other elements.

13. The method of claim 1, wherein the oxygen-containing gas is at least one gas selected from a group consisting of an oxygen gas and an ozone gas, and the hydrogen-containing gas is at least one gas selected from a group consisting of a hydrogen gas and a heavy hydrogen gas.

14. The method of claim 1, wherein in the formation of the silicon oxide film having the prescribed film thickness on the inside of the processing vessel, an annealing of the silicon oxide film having the prescribed film thickness formed on the inside of the processing vessel is further executed by supplying the oxygen-containing gas and the hydrogen-containing gas into the processing vessel that is heated and in which the pressure is set to be less than the atmospheric pressure, after forming the silicon oxide film having the prescribed film thickness on the inside of the processing vessel by alternately executing the formation of the silicon-containing layer and the change of the silicon-containing layer to the silicon oxide layer by oxidizing the silicon-containing layer.

15. The method of claim 14, wherein a temperature in the processing vessel in the annealing of the silicon oxide film having the prescribed film thickness formed on the inside of the processing vessel is set to be equivalent to a temperature in the processing vessel in the formation of the silicon oxide film having the prescribed film thickness on the inside of the processing vessel.

16. The method of claim 14, wherein a temperature in the processing vessel in the annealing of the silicon oxide film having the prescribed film thickness formed on the inside of the processing vessel is set to be higher than a temperature in the processing vessel in the formation of the silicon oxide film having the prescribed film thickness on the inside of the processing vessel.

17. The method of claim 1, wherein
in the formation of the thin film different from the silicon oxide film on the substrate, the processing gas is supplied into the processing vessel through a nozzle, in the removal of the deposit including the thin film adhered to the inside of the processing vessel, the deposit adhered to an inside of the nozzle is also removed by supplying the fluorine-containing gas into the nozzle, and in the formation of the silicon oxide film having the prescribed film thickness on the inside of the processing vessel, the silicon oxide film having a prescribed film thickness is formed on the inside of the nozzle by executing alternately forming the silicon-containing layer on the inside of the nozzle by supplying the silicon-containing gas into the nozzle that is heated and in which a pressure is set to be less than the atmospheric pressure, and changing the silicon-containing layer to a silicon oxide layer by oxidizing the silicon-containing layer by a reactive species containing atomic oxygen, the reactive species containing the atomic oxygen being generated by supplying the oxygen-containing gas and the hydrogen-containing gas into the nozzle that is heated and in which a pressure is set to be less than the atmospheric pressure, thermally activating the oxygen-containing gas and the hydrogen-containing gas in a non-plasma state and causing a reaction between the oxygen-containing gas and the hydrogen-containing gas in the nozzle.

18. A method for manufacturing a semiconductor device, the method comprising:

forming a first silicon oxide film having a prescribed film thickness on an inside of a processing vessel by alternately supplying a silicon-containing gas, and an oxygen-containing gas and a hydrogen-containing gas into the processing vessel in which a substrate is not housed;

forming a thin film different from the silicon oxide film on a substrate by supplying a processing gas into the processing vessel in which the substrate is housed after the formation of the silicon oxide film;

removing a deposit including the thin film adhered to the inside of the processing vessel by supplying a fluorine-containing gas into the processing vessel in which a substrate is not housed, after executing the formation of the thin film a prescribed number of times; and forming a second silicon oxide film having the prescribed film thickness on the inside of the processing vessel by alternately supplying the silicon-containing gas, and the oxygen-containing gas and the hydrogen-containing gas into the processing vessel in which a substrate is not housed, after the removal of the deposit, wherein:

the formation of the first silicon oxide film having the prescribed film thickness on the inside of the processing vessel and the formation of the second silicon oxide film having the prescribed film thickness on the inside of the processing vessel includes alternating:

(1) forming a silicon-containing layer on the inside of the processing vessel by supplying the silicon-containing gas into the processing vessel that is heated and in which a pressure is set to be less than an atmospheric pressure, and (2) changing the silicon-containing layer to a silicon oxide layer by oxidizing the silicon-containing layer by a reactive species containing atomic oxygen, the reactive species containing the atomic oxygen being generated by supplying the oxygen-containing gas and the hydrogen-containing gas into the processing vessel that is heated and in which a pressure is set to be less than the atmospheric pressure, thermally activating the oxygen-containing gas and the hydrogen-containing gas in a non-plasma state and causing a reaction between the oxygen-containing gas and the hydrogen-containing gas in the processing vessel, and in the formation of the second silicon oxide film having the prescribed film thickness on the inside of the processing vessel, fluorine remaining in the processing vessel is reacted with the reactive species containing the atomic oxygen, and is discharged, while forming the second silicon oxide film on the inside of the processing vessel.

19. The method of claim 18, wherein in the formation of the second silicon oxide film having the prescribed film thickness on the inside of the processing vessel in which the substrate is not housed, after the removal of the deposit, the first silicon oxide film, a part of which is removed together with the deposit when the deposit is removed, is repaired.

20. A substrate processing apparatus, comprising:
a processing vessel configured to house a substrate;
a heater configured to heat an inside of the processing vessel;
a pressure adjuster configured to adjust a pressure in the processing vessel;
a processing gas supply system configured to supply a processing gas into the processing vessel;
a fluorine-containing gas supply system configured to supply a fluorine-containing gas into the processing vessel;
a silicon-containing gas supply system configured to supply a silicon-containing gas into the processing vessel;
an oxygen-containing gas supply system configured to supply an oxygen-containing gas into the processing vessel;
a hydrogen-containing gas supply system configured to supply a hydrogen-containing gas into the processing vessel; and
a controller configured to control the heater, the pressure adjuster, the processing gas supply system, the fluorine-containing gas supply system, the silicon-containing gas supply system, the oxygen-containing gas supply system, and the hydrogen-containing gas supply system, the controller being configured to execute:

forming a thin film different from a silicon oxide film on a substrate by supplying the processing gas into the processing vessel in which the substrate is housed;

removing a deposit including the thin film adhered to the inside of the processing vessel by supplying the fluorine-containing gas into the processing vessel in which a substrate is not housed, after executing the formation of the thin film a prescribed number of times; and forming a silicon oxide film having a prescribed film thickness on the inside of the processing vessel by alternately supplying the silicon-containing gas, and the oxygen-containing gas and the hydrogen-containing gas into the processing vessel in which the substrate is not housed, after the removal of the deposit, wherein:

the formation of the silicon oxide film having the prescribed film thickness on the inside of the processing vessel includes alternating:
(1) forming a silicon-containing layer on the inside of the processing vessel by supplying the silicon-containing gas into the processing vessel that is heated and in which a pressure is set to be less than an atmospheric pressure, and
(2) changing the silicon-containing layer to a silicon oxide layer by oxidizing the silicon-containing layer by a reactive species containing atomic oxygen, the reactive species containing the atomic oxygen being generated by supplying the oxygen-containing gas and the hydrogen-containing gas into the processing vessel that is heated and in which a pressure is set to be less than the atmospheric pressure, thermally activating the oxygen-containing gas and the hydrogen-containing gas in a non-plasma state and causing a reaction between the oxygen-containing gas and the hydrogen-containing gas in the processing vessel, and the formation of the silicon oxide film having the prescribed film thickness on the inside of the processing vessel includes causing a reaction between fluorine remaining in the processing vessel and the reactive species containing the atomic oxygen, and discharging the fluorine, while forming the silicon oxide film on the inside of the processing vessel.

* * * * *